United States Patent
Majumdar et al.

(10) Patent No.: US 9,453,870 B1
(45) Date of Patent: Sep. 27, 2016

(54) TESTING FOR SHORTS BETWEEN INTERNAL NODES OF A POWER DISTRIBUTION GRID

(71) Applicant: Xilinx, Inc., San Jose, CA (US)

(72) Inventors: Amitava Majumdar, San Jose, CA (US); Richard W. Swanson, San Jose, CA (US); Anna W. Wong, Palo Alto, CA (US); Suraj Ethirajan, San Carlos, CA (US); Asim A. Bajwa, San Jose, CA (US); Jongheon Jeong, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 214 days.

(21) Appl. No.: 14/252,958

(22) Filed: Apr. 15, 2014

(51) Int. Cl.
   *G01R 31/14* (2006.01)
   *G01R 31/02* (2006.01)
(52) U.S. Cl.
   CPC .................................. *G01R 31/021* (2013.01)
(58) Field of Classification Search
   CPC .............................. G01R 31/025; G01R 27/18
   USPC ........................ 324/509, 508, 541, 544, 551
   See application file for complete search history.

(56) References Cited

U.S. PATENT DOCUMENTS

| | | | | |
|---|---|---|---|---|
| 4,140,964 A * | 2/1979 | Eubank | .................. | G01R 31/12 324/551 |
| 2004/0039536 A1* | 2/2004 | Garnett | .................. | G01R 31/40 702/58 |
| 2005/0040841 A1* | 2/2005 | Iadanza | .................. | G01R 31/40 324/764.01 |
| 2006/0061378 A1* | 3/2006 | Poechmueller | .... | G01R 31/3187 324/750.3 |
| 2008/0231286 A1* | 9/2008 | Tsunekazu | ........... | G01R 31/024 324/509 |
| 2011/0043285 A1* | 2/2011 | Zhao | ......................... | H03F 1/42 330/277 |
| 2011/0316506 A1* | 12/2011 | Bulzacchelli | ........... | G05F 1/575 323/282 |
| 2012/0068714 A1* | 3/2012 | Wang | .................... | G01R 31/025 324/414 |

* cited by examiner

*Primary Examiner* — Tung X Nguyen
*Assistant Examiner* — Dominic Hawkins
(74) *Attorney, Agent, or Firm* — w. Eric Webostad

(57) ABSTRACT

In an apparatus relating generally to an IC die, the IC die has a regulated power supply, a power supply grid, and a test circuit. The regulated power supply is biased between a source supply node and a source ground node, which are externally accessible nodes of the IC die. An internal supply node of the power supply grid is coupled to the regulated power supply. The test circuit is coupled to the internal supply node of the power supply grid. The test circuit is configured to test for at least one short in the power supply grid. The test circuit is configured to limit power through the power supply grid to less than that of a probe tip tolerance. The test circuit is configured to test for the at least one short in presence of background current leakage of the power supply grid.

19 Claims, 15 Drawing Sheets

| Short(s) | Bleeder Transistor(s) Used |
|---|---|
| A, D | 402 |
| B, H | 614 |
| C, F | 603 |
| E | 603 & 614 |
| G, I | 613 |

TESTING FOR SHORTS BETWEEN INTERNAL NODES OF A POWER DISTRIBUTION GRID

TECHNICAL FIELD

The following description relates to integrated circuit devices ("ICs"). More particularly, the following description relates to testing for shorts between internal nodes of power distribution grids of an IC.

BACKGROUND

Power consumption and supply noise have become more significant issues with more circuitry and high-speed operation, among other factors. Along those lines, IC power supplies may include on-die supplies, such as power-gated supplies and internally regulated power supplies ("IRPSs"). Power-gated supplies conventionally include a power transistor that allows power to unused circuit blocks to be turned off while other parts of an IC are still running. IRPSs conventionally provide a stable internal supply and internal ground to circuits of an IC. Circuits that are sensitive to power supply noise, such as for example analog and mixed-signal circuits, tend to use IRPSs for these types of applications.

An IRPS may be coupled to a power gating transistor, and so both of these types of on-die supplies may exist as an IRPS. However, an IRPS is coupled between an external supply and IRPS powered IC circuitry. Along those lines, there may be shorts in this coupling.

Accordingly, it would be desirable and useful to provide testing for use of an IRPS.

SUMMARY

An apparatus relates generally to an integrated circuit die. In such an apparatus, the integrated circuit die has a regulated power supply, a power supply grid, and a test circuit. The regulated power supply is biased between a source supply node and a source ground node. The source supply node and the source ground node are externally accessible nodes of the integrated circuit die. An internal supply node of the power supply grid is coupled to the regulated power supply. The test circuit is coupled to the internal supply node of the power supply grid. The test circuit is configured to test for at least one short in the power supply grid. The test circuit is configured to limit power through the power supply grid to less than that of a probe tip tolerance. The test circuit is configured to test for the at least one short in presence of background current leakage of the power supply grid.

A method relates generally to an integrated circuit die. In such a method, the integrated circuit die is powered up, where the integrated circuit die has a regulated power supply, a power supply grid, and a test circuit. The regulated power supply is biased between a source supply node and a source ground node. The source supply node and the source ground node are externally accessible nodes of the integrated circuit die. An internal supply node of the power supply grid is coupled with the regulated power supply. The test circuit is coupled to the internal supply node of the power supply grid. The regulated power supply is turned off. At least one bleeder transistor of the test circuit is turned on. The test circuit is configured to test for at least one short in the power supply grid. The test circuit is configured to limit power through the power supply grid to less than that of a probe tip tolerance. The test circuit is configured to test for the at least one short in presence of background current leakage of the power supply grid. Output of the test circuit is monitored to determine whether the power supply grid has the at least one short.

An apparatus relates generally to a voltage regulator. In such an apparatus, the voltage regulator is coupled to receive a reference voltage input. An output of the voltage regulator is coupled to an internal supply node and provided as a feedback input to the voltage regulator. A voltage sensor is coupled to the internal supply node to sense voltage on the internal supply node. The voltage regulator and an input portion of the voltage sensor are biased between a first externally accessible power supply and an externally accessible ground. An output portion of the voltage sensor is biased between a second externally accessible power supply and the externally accessible ground. The second externally accessible power supply is set to a level below a logic high level voltage for testing for a short associated with the internal supply node.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

Multiple on-die power-supply nodes that are not directly connected to external supplies are becoming more prevalent. Examples are internally-regulated supplies and power-gated supplies. This makes testing for shorts between such internal supply grids and internal and/or external supply grids more problematic. Presence of such shorts may result in excessive current draw from a tester, and eventually this may result in burnt probe-tips. This adds to the overall cost of test due to false negatives and/or probe tip burn out. To mitigate or eliminate either or both of false negatives in testing for shorts and/or burnt probe tips due to excessive power drawn through a short, saving semiconductor companies significant production cost, short testing as described below in detail may be used.

Generally, regulation of power through a short is used to prevent exceeding a probe tip threshold to mitigate or avoid burnt probe tips. Such power from supply to ground may be regulated according to two limits. A first limit is background current leakage of a power supply grid. Some current leakage may be present as background current leakage, namely not a sufficient amount indicative of a short. A second limit is a probe pin maximum power, as a probe pin may be used to test an IC die, whether a standalone die or as part of a wafer. Such probe pin maximum power may be associated with either or both a maximum current or a maximum voltage. In addition to detection of the presence of at least one short during testing, such testing may maximize an ability to detect a short, i.e. maximize detectable short resistance. Along those lines, a maximum resistance may be determined as association with a short.

With the above general understanding borne in mind, various configurations for testing for shorts to internal nodes of a power grid are generally described below.

Figure 1:
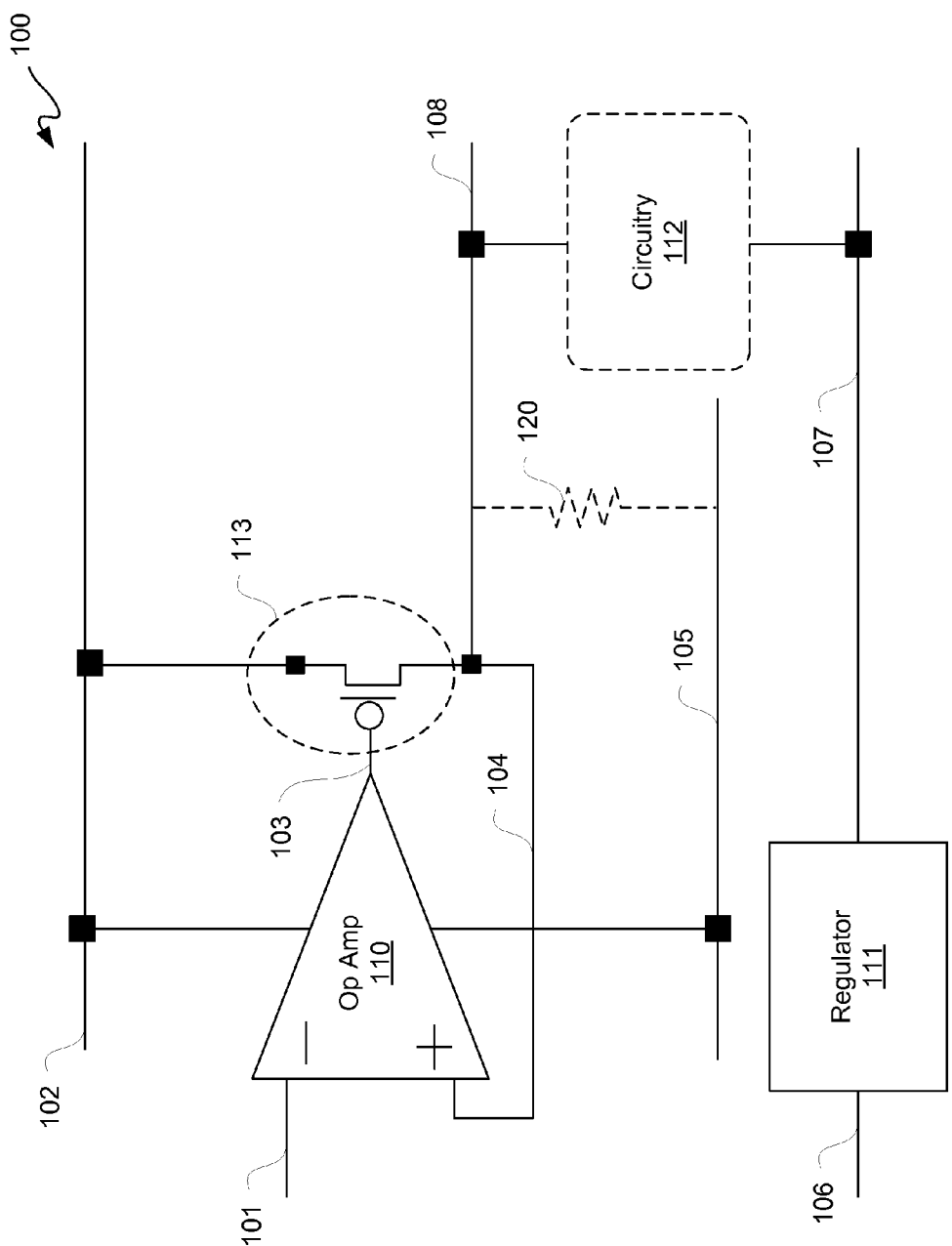
FIG. 1 is a block/circuit diagram depicting an exemplary internally-regulated power supply ("IRPS").

FIG. 1 is a block/circuit diagram depicting an exemplary internally-regulated power supply ("IRPS") 100. By internal, it is generally meant on-chip or on-die, which may include without limitation a stacked die package. A stacked die package may include two or more IC dies coupled to an interposer die, two or more IC dies in a stack, or a combination thereof. In this example, IRPS 100 includes an operation amplifier ("op amp") 110, a large current source transistor 113, and an on-die voltage regulator ("regulator") 111.

A minus input port of op amp 110 may be coupled to receive a reference voltage 101. Such reference voltage 101 may be provided from a stable source, such as a band-gap circuit; however, another type of reference voltage source may be used. For example, rather than an op amp 110, a digital control may be used to provide an output voltage 103.

Output voltage 103 of op amp 110 is provided as a gating signal to a large current source transistor 113. In this example, transistor 113 is a PMOS transistor; however, another type of transistor may be used. A source node of transistor 113 is coupled to a source power supply bus or source power supply voltage ("source supply") 102. Source supply 102 is an externally supplied, namely off-chip or off-die, power source. A drain node of transistor 113 is coupled to an internally supplied power supply bus or power supply voltage ("internal supply") 108. Such drain node of transistor 113 is further coupled as a feedback input ("feedback voltage") to a plus port of op amp 110, which is the same voltage as internal supply 108.

Op amp 110 may be biased between source supply 102 and a source ground bus or source ground voltage ("source ground") 105 for operation of op amp 110. For example, a band-gap reference voltage 101 (e.g., approximately 1.22 volts or other voltage level) may be used to drive a current-source PMOS transistor 113 to supply current to internal circuitry 112. Such internal circuitry 112 may include analog circuits that depend upon a stable power supply.

Accordingly, gain of op amp 110 may be high, so output voltage 103, which is an amplified difference between reference voltage 101 and internal supply or feedback voltage 108, so as to effectively adjust current flow responsive to a difference between reference voltage 101 and feedback voltage 108. Thus, effectively output voltage 103 may at least approximate reference voltage 101. Along those lines, transistor 113 may be sized, as well as gated, to limit current flow from source supply 102 to regulate internal supply 108. While output voltage 103 may be negative, generally output voltage 103 is a positive value greater than zero volts, where transistor 113 is operated in a biased state or range rather than a saturation state.

A short circuit defect, illustratively depicted as a resistor ("short") 120 with a dashed line, may be present between internal supply 108 and source ground 105. In brief, a short 120 may exist between nodes and/or buses of internal supply 108 and source ground 105, where internal supply 108 is not accessible by a probe pin, and source ground 105 is accessible to probing by a probe pin.

A reference ground 106 may be coupled on an input side of regulator 111. An output side of regulator 111 may be coupled to an internally supplied ground bus or ground voltage ("internal ground") 107. Circuitry 112 may be biased between internal supply 108 and internal ground 107. Circuitry 112 is shown in a dashed box is not part of IRPS 100. However, circuitry 112 may be powered by IRPS 100. Neither internal supply 108 nor internal ground 107 may be accessible by a probe pin. Such probing may be at a chip-level or die-level, or may be at a wafer-level.

For example, as circuitry 112 draws more power, voltage on internal supply 108 may be pulled down. A lower feedback voltage 108 may cause output voltage 103 to move closer to a ground potential, and a lower gating voltage causes PMOS transistor 113 to be in a more conductive biased state to allow more current to flow from source supply 102 through transistor 113 to internal supply 108.

With respect to wafer-level probing, conventionally a subset of nodes is powered-up, as there are too many nodes to power-up for conventional probing. Along those lines, current density may be greater for such subset of circuitry that is powered up, because only a subset of circuitry on a die on a wafer is powered up for such conventional probing. However, it is useful to identify any and all dies on a wafer that are defective, so as to avoid costs associated with subsequent processing of any such dies on a wafer. However, if, for example, a probe pin or tip is limited to a current of 200 milliamps ("mA"), then a short 120 may draw too much current when probing source ground 105. In other words, placing a probe pin on a source ground node 105 in the presence of a short 120 when IRPS 100 is powered-up may burn-out such probe pin. Accordingly, in general, a probe-pin or probe-tip may be used to probe either power or ground for one or more power or ground grids. In the absence of a short defect among these power and ground grids, circuitry powered by these grids draws a certain amount of current during testing. However, in the presence of a short defect, the current drawn by such circuitry and such a short defect together may exceed a maximum current that such a probe-tip can source.

Figure 2:
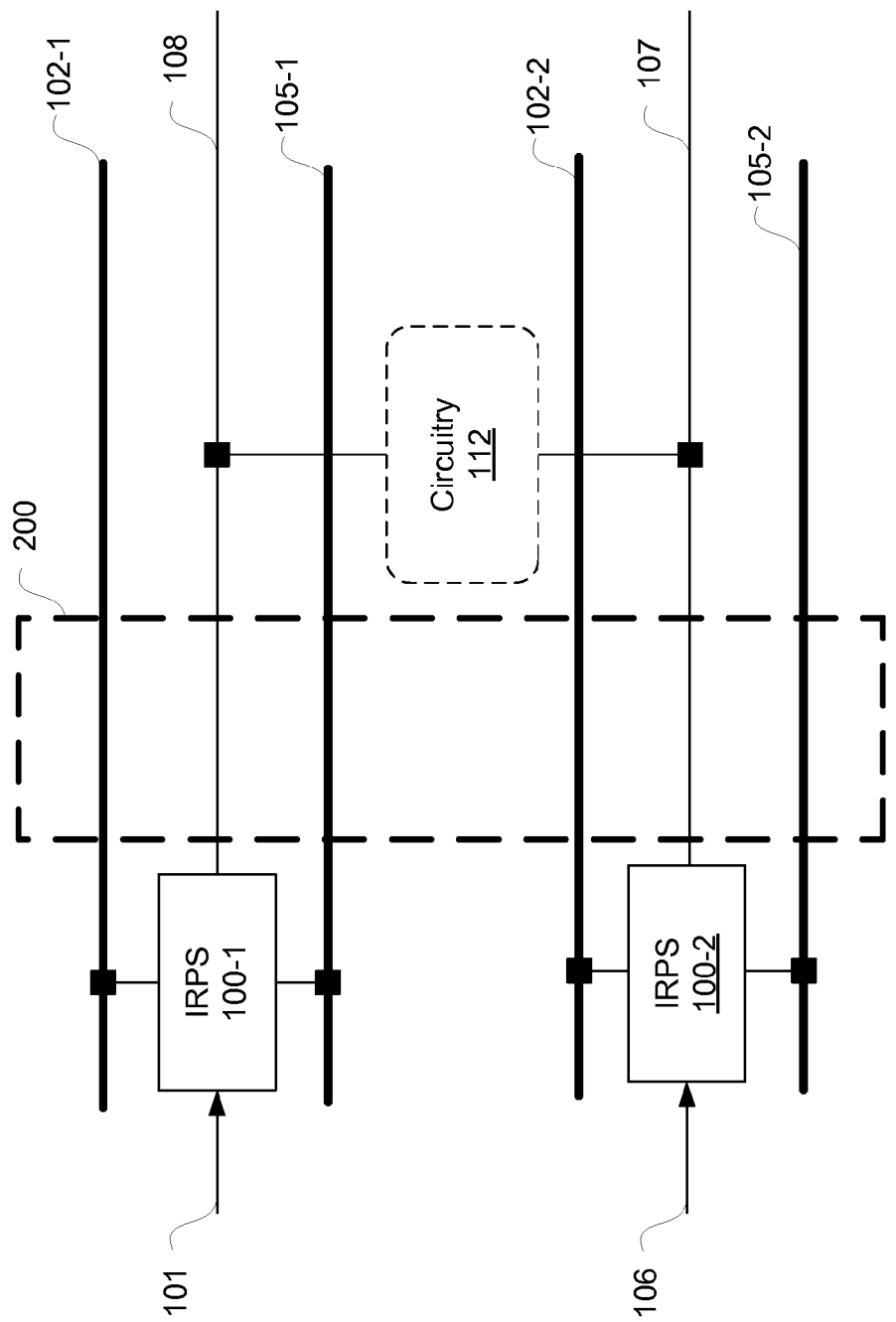
FIG. 2 is a block diagram depicting an exemplary IRPS grid.

FIG. 2 is a block diagram depicting an exemplary IRPS grid 200. IRPS grid 200 includes IRPS 100-1 and IRPS 100-2, which may be separate instances of IRPS 100 of FIG. 1. In this example, IRPS 100-1 is biased between source supply 102-1 and source ground 105-1, where both source supply 102-1 and source ground 105-1 are pin accessible. Likewise, in this example, IRPS 100-2 is biased between source supply 102-2 and source ground 105-2, where both source supply 102-2 and source ground 105-2 are pin accessible. Source supplies 102-1 and 102-2 may be coupled to same or separate externally accessible pins or other types of contacts for biasing circuitry of a chip, and likewise ground supplies 105-1 and 105-2 may be coupled to same or separate externally accessible pins or other types of contacts for biasing circuitry of a chip. Generally, distinct power and ground rails are used for source supply and source ground pairs.

A reference voltage 101 may be provided to IRPS 101-1 and a reference ground 106 may be provided to IRPS 101-2. An internal supply 108 may be provided by IRPS 100-1, and an internal ground 107 may be provided by IRPS 100-2. Circuitry 112 may be biased between such internal supply 108 provided by IRPS 100-1 and internal ground 107 provided by IRPS 100-2.

Whether an IRPS 100 or an IRPS grid 200, state of a power gating transistor 113 may be unknown during power-up. However, an external source supply 102 may have to be powered up for an internal supply 108 to be operative. Additionally, one or more internal supplies 108 on an IC die on a wafer may not be directly coupled to an external supply in some or all power states, but may be coupled through an IRPS. In the past, a small voltage difference was applied between an internal supply and a source ground while monitoring current drawn from a tester to see if it exceeded a pre-set threshold. However, in order to apply any voltage difference across an internal supply 108 and source ground 105, source supply 102 is fully powered up so that op amp 110 and current source transistor 113 are properly biased. As there may be a short 120 during such power-up, voltage difference between internal supply 108 and source ground 105 is not guaranteed to be sufficiently small to avoid damage. Depending on the resistance of short 120, current drawn by short 120 to source ground 105 could be too large for safe testing conditions, which may result in damaged probe pins. In other words, an IC die with a short 120 may be fatally defective anyway; however, a probe tip used to supply current from a tester to an IC die may be rated for a maximum current (e.g., approximately 200 mA), and thus if such maximum current is exceeded through such probe tip, heat generated may burn up such a probe tip.

While burnt probe tips add to the overall cost of production, the above-described short, as well as other types of shorts including combinations thereof, conventionally were not immediately detected. For example, such shorts may have a high resistance making them difficult to detect. Such undetected shorting in the past may cause failures downstream, which may result in significant additional cost. As described below in additional detail, technology is described to mitigate against loss of probe tips, as well as to provide early detection of one or more shorts.

With renewed reference to FIG. 2, effectively there are 6 grids, namely source supplies 102-1 and 102-2, source grounds 105-1 and 105-2, internal supply 108, and internal ground 107. Short defects may exist between different pairs of these grids, with a possibility of 15 different combinations of pairs of grids. However, six of these pairs only affect source supplies, and hence are directly testable and accessible from external pins or other contacts. Thus, there are nine short-defect types or classes that involve at least one internal grid, namely at least one of internal supply 108 or internal ground 107.

Figure 3:
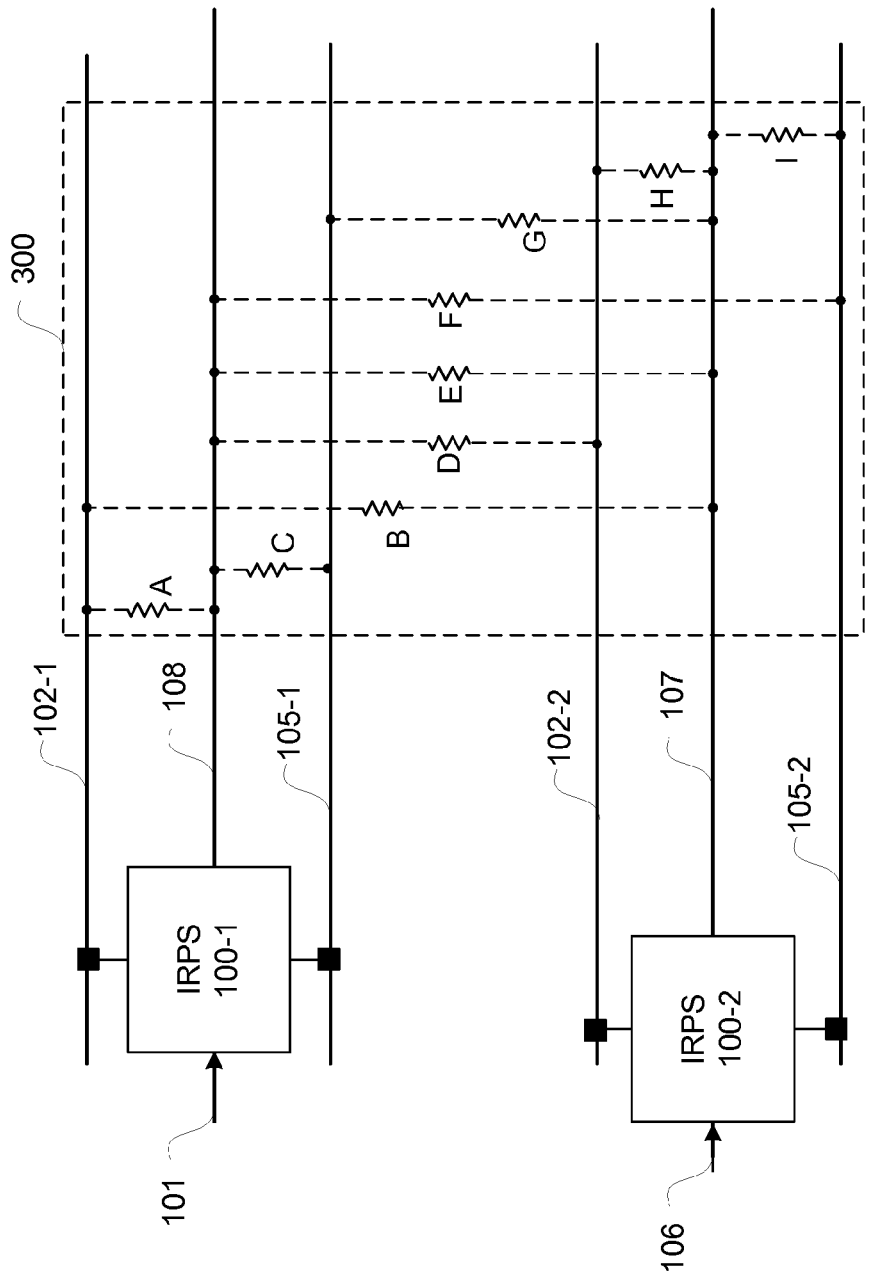
FIG. 3 is the diagram of FIG. 2 with examples of possible short defects.

Along the above-lines, FIG. 3 is the diagram of FIG. 2 without circuitry 112 and with examples of possible short defects 300 labeled A through I, namely shorts or classes or types of shorts A through I.

Each of short types A through I is illustratively depicted with a resistor. Short type A is effectively coupled directly between source supply 102-1 and internal supply 108. Short type B is effectively coupled directly between source supply 102-1 and internal ground 107. Short type C is effectively coupled directly between internal supply 108 and source ground 105-1. Short type D is effectively coupled directly between internal supply 108 and source supply 102-2. Short type E is effectively coupled directly between internal supply 108 and internal ground 107. Short type F is effectively coupled directly between internal supply 108 and source ground 105-2. Short type G is effectively coupled directly between source ground 105-1 and internal ground 107. Short type H is effectively coupled directly between source supply 102-2 and internal ground 107. Lastly, short type I is effectively coupled directly between internal ground 107 and source ground 105-2.

If source and internal supply grids share one or more physical grids or buses, then some of these defect classes of shorts may not be distinct from one another. For example, shorts C and E may generally be indistinguishable if a source ground 105-1 is shared with an internal ground 107. However, each of short types A through I involves shorting to either internal supply 108 or internal ground 107, namely individually each of these short types A through I is directly coupled to an internal grid.

Some multiple defects, such as for example shorts A and C (or H and I), occurring simultaneously in a same IC die may be detectable during conventional tests for shorts of a source supply to a source ground, and thus these and other conventionally detectable multiple defect instances are not described in additional detail. In other words, dependency on being shorted to either internal supply 108 or internal ground 107 is effectively removed by continuity provided by having shorts coupling to externally accessible pins or contacts.

Short types A and I are considered. Each instance of these short types may have approximately the same potential at their respective ends during operation. For example, an instance of short type A may have approximately the same potential at both ends thereof, namely source supply 102-1 and internal supply 108, during operation, and an instance of short type I may have approximately the same potential at both ends thereof, namely source ground 105-2 and internal ground 107, during operation. However, a regulated internal node, such as internal ground 107 and internal supply 108 for example, are expected to be stable and free of noise, including without limitation low frequency noise, whereas source supply and source ground nodes, such as source supply 102-1 and source ground 105-2 for example, may be noisy in comparison to either of such internal nodes. An IRPS may de-couple an internal supply node and/or internal ground node from influences of an external source supply and external source ground node corresponding thereto. Thus, for example, an instance of short type I may render a regulator useless and cause circuit malfunction. Similarly, for example for power gating, an instance of short type A that bypasses one or more power-gating transistors can render a power management scheme ineffective, such as by drawing more power than specified.

In general, resistances of short types A through I may be a relevant parameter. A highly resistive short, such as for example of a giga-ohm or higher, between two nodes may be tolerable in some applications, whereas the same short with a resistance in the kilo-ohm range may be considered an actual defect. Along those lines, resistance thresholds may be set for each of short types A through I, and these resistance thresholds may be different for different instances of shorts. However, such thresholds may vary based on a design and/or technology, and thus thresholds may vary from application to application. Accordingly, in the following description, circuitry is generally described for detecting short types A through I, and such circuitry may be designed or otherwise adapted for any resistance threshold. Moreover, shorts may be detected by current monitoring ("current monitoring") or voltage monitoring ("VM") or a combination thereof.

Figure 4:
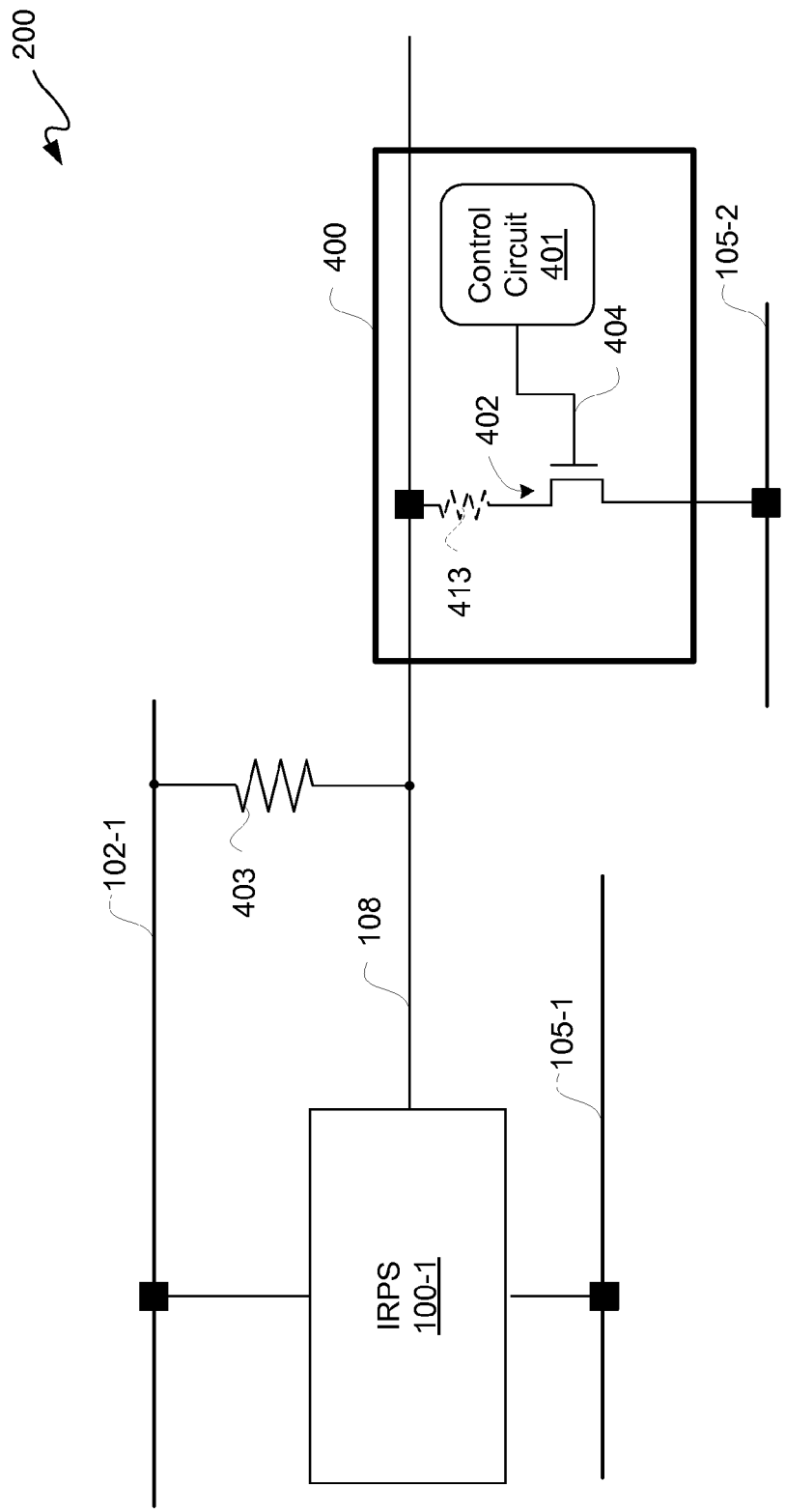
FIG. 4 is a block diagram depicting an exemplary IRPS grid with a bleeder transistor circuit.

FIG. 4 is a block diagram depicting an exemplary IRPS grid 200 with a bleeder transistor circuit 400. Bleeder transistor circuit 400 includes a control circuit 401 and a bleeder transistor 402, and optionally includes a current limiting resistor 413. Bleeder transistor circuit 400 is coupled for current monitoring. Generally, bleeder transistor circuit 400 is configured to apply a potential difference across the hypothesized short defect involving an internal supply node, monitor the amount of current drawn by such a short, and, based on the current drawn, the magnitude of such a short may be determined. Configuration and coupling of bleeder transistor circuit 400 depends on which type of short types A through I are being monitored for during current monitoring. Even though FIG. 4 is for a short type A, as generally indicated by short resistance 403, the following description may be applied to other types of shorts.

In this example, source supply 102-1 is assumed to be at a logic high level voltage $V_{dd}$. An NMOS "bleeder" transistor 402 has a drain node or drain region coupled to an internal supply 108 and has a source node or source region coupled to a pin-accessible source ground 105-2, which may be coupled or provided by an external instrument (e.g., Automated Test Equipment ("ATE")). Generally, any externally accessible pad may be used for a ground. An NMOS bleeder transistor 402 may be used as a potential difference between source supply 102-1 and internal supply node 108, and this potential difference may be positive. An optional current limiting resistor 413 may be coupled in series with a drain node of transistor 402. A bias voltage 404 may be provided to a gate of transistor 402. Bias voltage 404 may be provided from control circuit 401 to bleeder transistor 402.

Bias voltage 404 applied to a gate of transistor 402 may be used to control current flow through a channel of transistor 402, namely to limit current flow through a channel of transistor 402. Additionally, bias voltage 404 may be used to adjust sensitivity of testing for a short resistance 403. While low resistances are readily detectable as shorts, a high resistance short may be more problematic to detect. Thus, current flow through to source ground 105-2 may be initially restricted to a small amount, with circuitry coupled to such power distribution grid turned off, so such a small amount of current flow is sufficient to indicate presence of a short but less than that which would burn out a probe-tip, such as approximately ten micro-amperes ("uA") for example. In other words for example, while the current limit of a probe-tip may be 200 mA, during shorts testing as described herein, all circuitry coupled to a power distribution grid may be turned off, and a small voltage may be applied across power 102-1 and ground 105-2, where a current of even 10 uA may signal the presence of a short. In this example, bias voltage 404 is digital, namely set to either a logic high or logic low state. However, in other implementations, bias voltage 404 may be provided as an analog signal.

Figure 5:
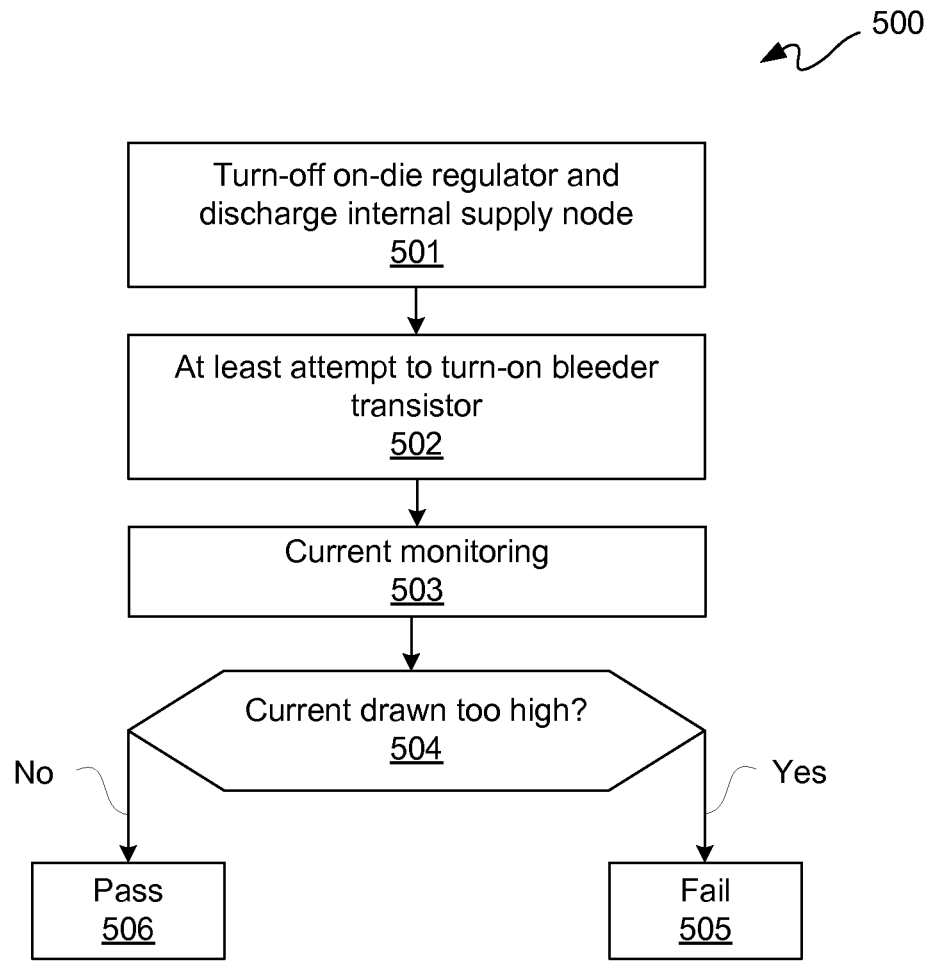
FIG. 5 is a flow diagram depicting an exemplary test flow for the IRPS grid of FIG. 4.

FIG. 5 is a flow diagram depicting an exemplary test flow 500 for IRPS grid 200 of FIG. 4. With simultaneous reference to FIGS. 4 and 5, test flow 500 is further described.

For test flow 500, an on-die regulator, such as IRPS 100-1 for example, is turned off at 501. Further, as part of test initialization at 501, internal supply node 108 is discharged to ground, after which at least an attempt to turn on bleeder transistor 402 may be initiated.

At 502, bleeder transistor 402 is at least attempted to be put into a substantially conductive state ("turned on") by control circuit 401. At 503, current monitoring is performed. At 504, it is determined if current drawn is too high or not through an IRPS grid 200. If current draw is not too high as determined at 504, then an IRPS grid 200 of a part may be passed at 506. If current draw is determined to be too high at 504, then an IRPS grid 200 of a part may be failed at 505. If a current as measured at 503 exceeds a threshold level at 504, where such threshold level indicates a presence of a short, then at 504 such current may be deemed to be caused by a short. A current deemed to be too high at 504, namely exceeding a threshold level for such current, may then be used to fail an IRPS grid 200 of a part at 505.

Thus, effectively at 504 it is determined if a short is detected. If there is no short or resistance of any short 403 is too high for parameters of this test, then transistor 402 is in a substantially non-conductive state ("off"), namely transistor 402 stays in a deep triode region independently of bias voltage 404 provided from control circuit 401 at 501. In other words, an IRPS grid 200 of a part passes this test at 504.

However, if at 504 a short 403 is detected as having resistance within detectable parameters of this test based on current monitored at 503 exceeding a threshold, then IRPS grid 200 may be failed at 505. For a short, transistor 402 starts conducting from source supply 102-1 through short 403 to internal supply 108 through a channel of transistor 402 to source ground 105-2.

As the amount of current drawn may depend on resistance of short 403, the amount of bias voltage 404 applied at the gate of transistor 402, and fixed parameters of transistor 402, current monitoring at 505 effectively may indicate the resistance of short 403. For sufficiently high values of resistance of short 403, transistor 402 may operate in a triode region. For sufficiently low values of resistance of short 403, transistor 402 may enter a saturation state for conduction (i.e., turn on). The amount of current drawn by bleeder transistor 402 can be monitored at 505 by an ATE or other current monitor (not shown). In a configuration, an analog signal may be provided as bias voltage 404 from control circuit 401 to allow for transistor 402 to be biased at multiple levels. In such a configuration, testing can start with a small bias voltage to check for large shorts that may result in test equipment damage, and then such testing may gradually progress to higher and higher voltages, where progressively smaller shorts (i.e., progressively larger short resistances) can be detected as they may negatively impact performance of a part. For such a configuration, bias voltage 404 may be increased in discrete steps with leakage monitored after each step or as a voltage ramp with leakage being continually monitored.

Figure 6:
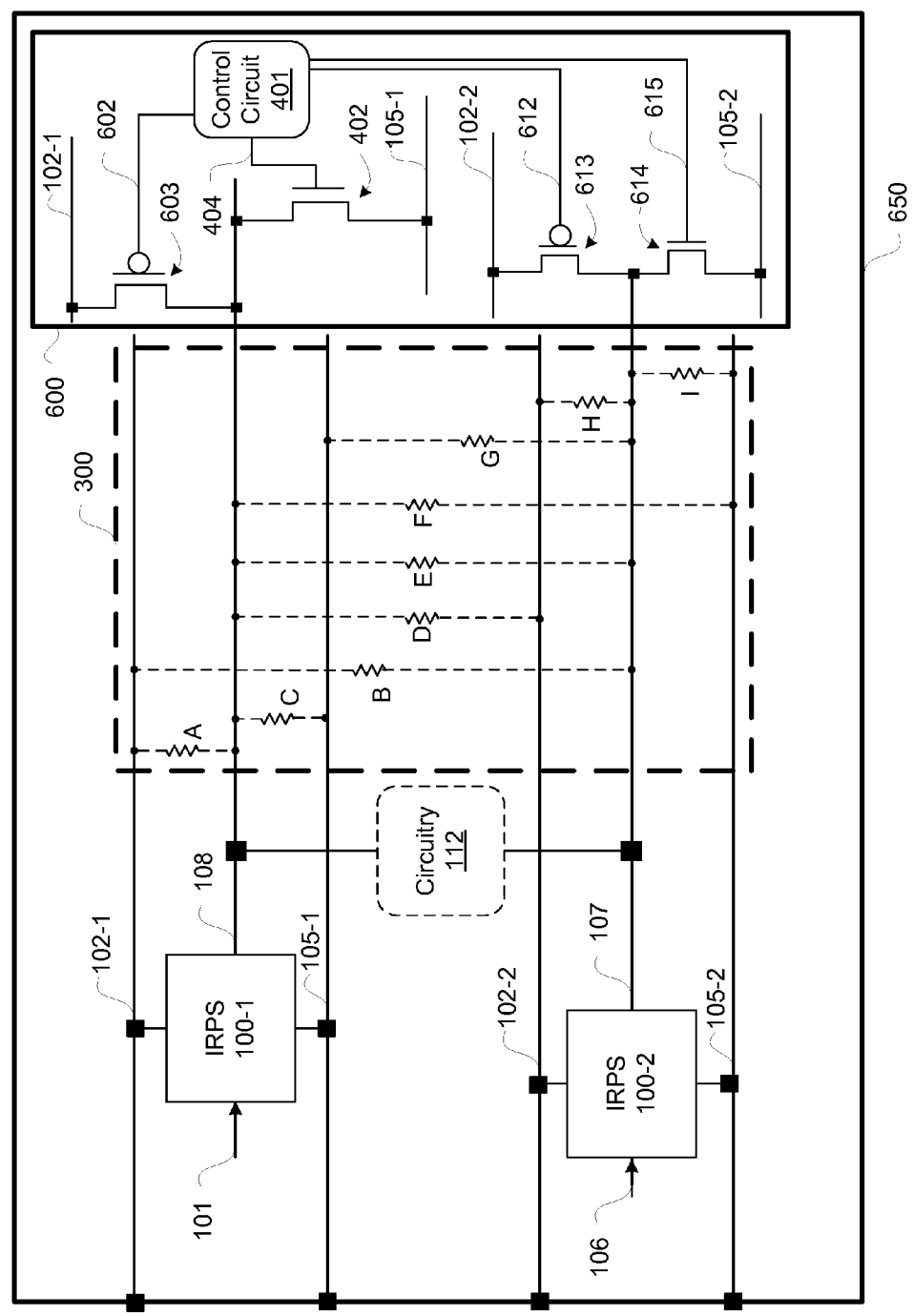
FIG. 6 is a circuit/block diagram depicting the exemplary IRPS grid of FIG. 2 with short defects of FIG. 3 and with an on-die test circuit coupled to the IRPS grid of an IC die for current monitoring.

FIG. 6 is a circuit/block diagram depicting an exemplary IRPS grid 200 of FIG. 2 with short defect types of FIG. 3 and with on-die test circuit 600 coupled to IRPS grid 200 of an IC die 650 for current monitoring. IC die 650 may be any IC die having an IRPS, including without limitation an FPGA die.

Test circuit 600 may include bleeder transistor 402 and control circuit 401 coupled to IRPS grid 200 as previously described, as well as bleeder transistors 603, 613, and 614. Even though source supply 102-1, source supply 102-2, source ground 105-1, and source ground 105-2 are illustratively depicted as powers and grounds for test circuit 600, it should be understood that any externally accessible power and ground may be used in accordance with the description herein for coupling to ATE, where power may be controllably applied by such ATE and where current drawn may be controllably measured by such ATE.

Bleeder transistor 402 is coupled to detect shorts while restricting faulty current through individual probe-pins to be below a maximum current for such probe pins for any short-defect, including without limitation very low values of short circuit resistance. By sizing width and length of transistor 402, and by controllably biasing transistor 402 with a bias voltage 404 such that saturation current does not exceed a maximum current for a probe pin, a short may be detected without burning out a probe pin. In this example, bleeder transistor 402 has a source region coupled to source ground 105-1.

Along the same lines, bleeder transistors 603, 613, and 614 may be sized and biased to protect probe pins. Along those lines, bleeder transistor 603 may be a PMOS transistor having a source node coupled to source supply 102-1 and a drain node coupled to internal supply node 108. Control circuit 401 may be coupled to controllably provide a bias voltage 602 to a gate of bleeder transistor 603. Bleeder transistor 613 may be a PMOS transistor having a source node coupled to source supply 102-2 and a drain node coupled to internal ground 107. Control circuit 401 may be coupled to controllably provide a bias voltage 612 to a gate of bleeder transistor 613. Bleeder transistor 614 may be an NMOS transistor having a drain node coupled to internal ground 107 and a source node coupled to source ground 105-2. Control circuit 401 may be coupled to controllably provide a bias voltage 615 to a gate of bleeder transistor 614. Thus, current flows through bleeder transistors may be controlled. Likewise, ATE supplied supply voltages may be controllably controlled.

Current through bleeder transistors may be limited by sizing channel W and/or L of such transistors. Additionally, a current limiting resistor, such as current limiting resistor 413 as previously described, may be coupled in series with each bleeder transistor.

Figures 7, 8:
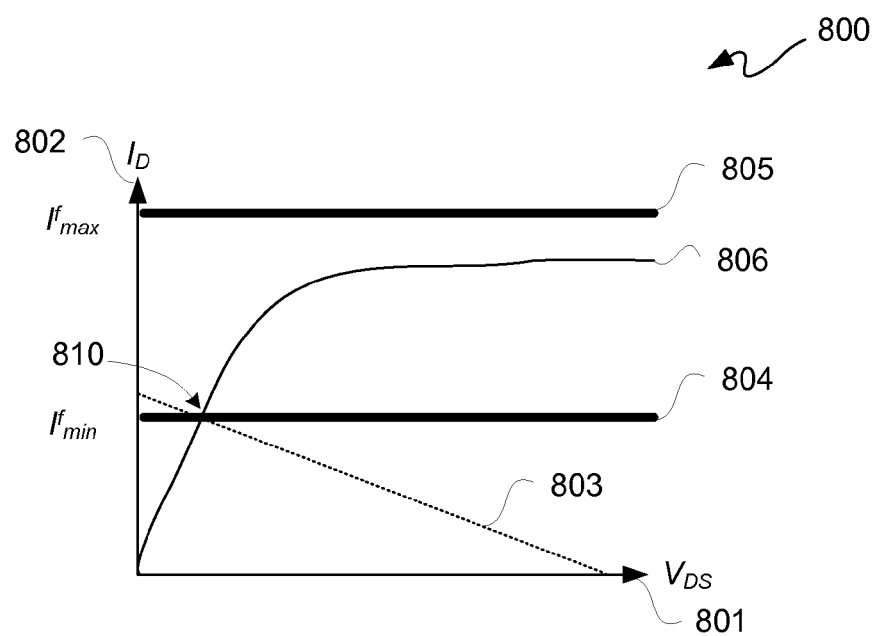
FIG. 7 is a table diagram depicting an exemplary table for short(s) versus bleeder transistor(s) used for testing in accordance with FIG. 6.
FIG. 8 is a graph depicting an exemplary transistor I-V curve.

FIG. 7 is a table diagram depicting an exemplary table 700 for short(s) versus bleeder transistor(s) used for testing in accordance with FIG. 6. With simultaneous reference to FIGS. 6 and 7, table 700 is further described.

For short types A and D, a bias voltage 404 may be controllably applied to bias bleeder transistor 402 to check for presence of any or all of short types A and D, and bleeder transistors 603, 613, and 614 may be turned off during such checking. For short types B and H, a bias voltage 615 may be controllably applied to bias bleeder transistor 614 to check for presence of any or all of short types B and H, and bleeder transistors 402, 603, and 613 may be turned off during such checking. For short types C and F, a bias voltage 602 may be controllably applied to bias bleeder transistor 603 to check for presence of any or all of short types C and F, and bleeder transistors 402, 613, and 614 may be turned off during such checking. For short type E, bias voltages 602 and 615 may be controllably applied to respectively bias bleeder transistor 603 and 614 to check for presence of a short type E, and bleeder transistors 402 and 613 may be turned off during such checking. For short types I and G a bias voltage 612 may be controllably applied to bias bleeder transistor 613 to check for presence of any or all of short types I and G and bleeder transistors 402, 603, and 614 may be turned off during such checking.

FIG. 8 is a graph 800 depicting an exemplary transistor I-V curve 806. Transistor I-V curve 806 may be for any of the bleeder transistors of FIG. 6. Transistor I-V curve 806 is for a drain-to-source voltage $V_{DS}$ along an x-axis 801 versus a drain current $I_D$ along a y-axis 802. Transistor I-V curve 806 may be selected from a family of such curves, as known, for a bleeder transistor having different generally linear resistive region to saturation region transitions.

A constant bias voltage $V_b$ may be applied at the gate of a bleeder transistor of FIG. 6, and such bleeder transistor may be sized for channel width W and channel length L, and thus with constant bias voltage $V_b$ and dimensions W and L, a transistor I-V curve 806 may be selected from a plurality of transistor I-V curves for such bleeder transistor. A short of short types A through I may be represented as a load line 803 in this I-V graph of such a bleeder transistor. Resistance $R_S$ of a short defect may determine slope of load line 803, which is a negative slope. The larger the value of resistance $R_S$, the larger the (or less negative) the slope of a corresponding load line 803. A current drawn by a short-defect may be computed or otherwise determined by finding an intersection 810 of transistor I-V curve 806 as determined by $V_B$, W and L, and load line 803 defined by resistance $R_S$.

A minimum discernible faulty current or leakage "floor" 804 may be a minimum current $I_{min}^f$ that a tester may definitively deem as being the result of a short. Currents below a value of leakage "floor" 804 may be caused by other leakage and may not result from a short or shorts. Accordingly, values below leakage "floor" 804 may be considered unreliable indicators of a short defect. A value of leakage "floor" 804 may be determined by process technology, active area, test setup, and/or measurement circuitry. A value for a maximum faulty current or current "ceiling" 805 may be determined according to a maximum current a probe tip can handle. Accordingly, a transistor I-V curve 806 may be selected to have a portion that lies between leakage floor 804 and leakage ceiling 805.

A maximum faulty resistance $R_F$ that may be detected using a test setup with a bias voltage and sized bleeder transistors as described with reference to FIG. 6 may be at intersection 810, namely where a transistor I-V curve 806, for a bias voltage $V_b$, transistor width W and transistor length L, intersects a drain current $I_D$ for such a biased bleeder transistor, namely where drain current $I_D$ equals a leakage floor (or minimum current) $I_{min}^f$ for leakage floor 804. Intersection 810 may be in a triode region or a saturation region of transistor I-V curve 806, and a load line 803 passing through intersection 810 indicates a maximum faulty resistance $R_F$ that is detectable by a process as described herein, under the constraints imposed by a leakage floor current For a bias voltage $V_b$ and a bleeder transistor threshold voltage $V_t$, a difference (i.e., $V_b$-$V_t$) or output voltage $V_O$ may be used to define an interim voltage $V_h$ which is a supply voltage $V_{dd}$ less such output voltage $V_O$. Assuming leakage floor 804 intersects a selected transistor I-V curve 806 in a triode region, a first order estimate of a maximum faulty resistance $R_F$ may be mathematically expressed as follows:

$$R_F = \frac{V_h - \sqrt{V_h^2 + \frac{2I_{min}^f}{k} + \frac{V_{dd}}{2}(2V_h - V_{dd})}}{I_{min}^f} \quad (1)$$

Second order effects, such as transistor body effect, channel length modulation, and/or sub-threshold voltage operation, are not included here, but may be considered.

In addition to detection of short defects between IRPS grids and power-ground grids, increasing sensitivity for detection of shorts may be useful to provide earlier detection. Along those lines, from a chain rule of partial derivatives from Equation 1, a bias voltage $V_b$ that maximizes faulty resistance $R_F$ may be mathematically determined as follows:

$$\frac{\partial R_F}{\partial V_b} = \frac{1}{I_{min}^f} \frac{2V_h + V_{dd}}{\sqrt{2V_h^2 + \frac{2I_{min}^f}{k} + \frac{V_{dd}}{2}2V_h - V_{dd}}} - 1. \quad (2)$$

From Equation 1, interim voltage $V_h$ may be mathematically expressed as follows:

$$V_h > \sqrt{V_h^2 + \frac{2I_{min}^f}{k} + \frac{V_{dd}}{2}2V_h - V_{dd}}. \quad (3)$$

This proves that $$\frac{\partial R_F}{\partial V_b} > 0.$$

From this it may be appreciated that faulty resistance $R_F$ may be maximized by maximizing bias voltage $V_b$ with the constraint that a drain current $I_D$ for saturation is less than $I_{max}^f$ for leakage ceiling 805. For properly sized bleeder transistors, a bias voltage $V_b$ may be equal to a full-overdrive voltage, i.e. $V_{dd}$ for NMOS bleeder transistors and ground or zero volts for PMOS bleeder transistors. The above description is for a leakage floor provided as a fixed parameter; however, in another configuration sensitivity may be increased, namely the value of resistance $R_F$ may be increased, by reducing such a leakage floor.

Figure 9:
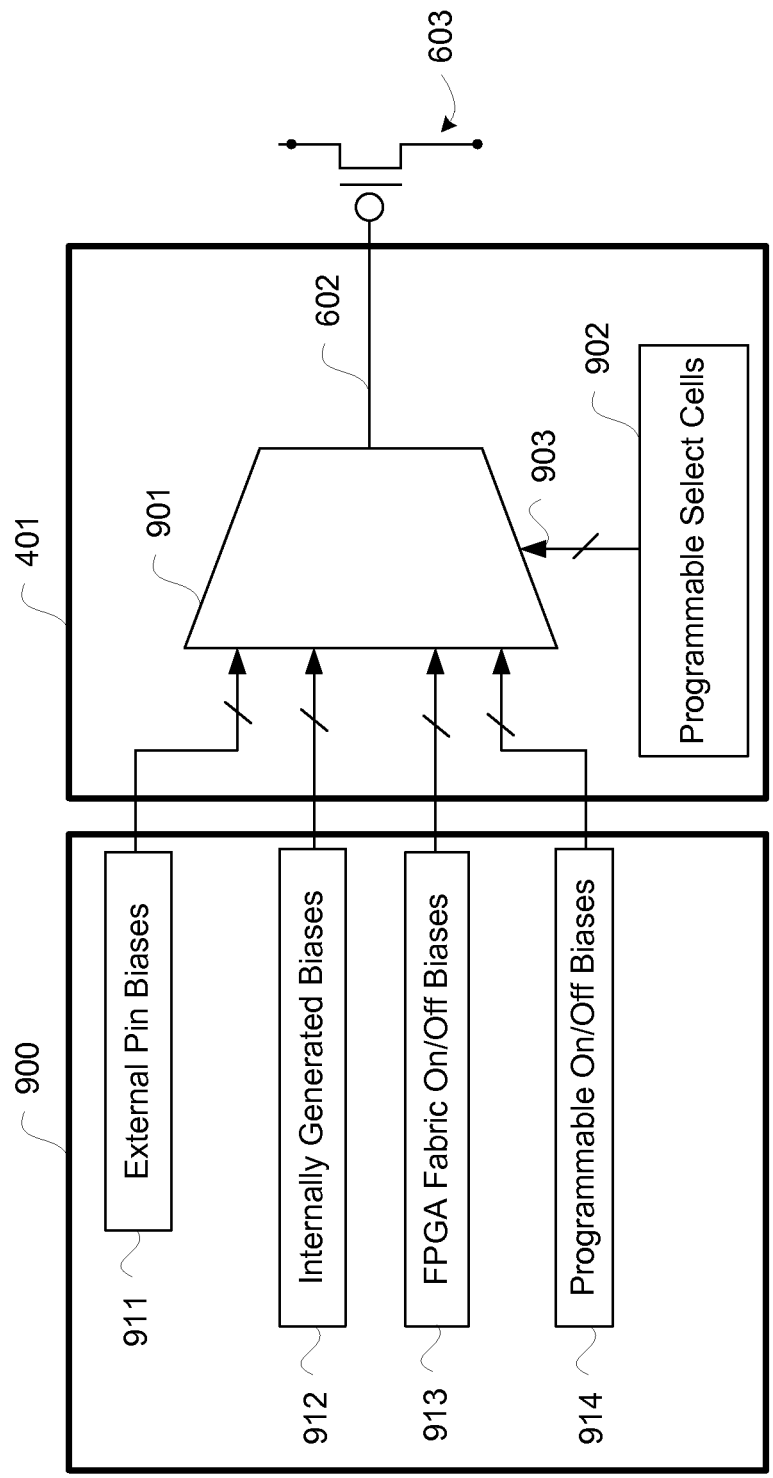
FIG. 9 is a block/circuit diagram depicting an exemplary control circuit for providing a bias voltage for biasing a bleeder transistor such as in FIG. 6.

FIG. 9 is a block/circuit diagram depicting an exemplary control circuit 401 for providing a bias voltage 602 for biasing a bleeder transistor 603 such as in FIG. 6. Even though this example is for providing a bias voltage 602 to a gate of a PMOS bleeder transistor 603, it should be understood that control circuit 401 as described herein may be expanded to include any or all of the bias voltages for any or all of the bleeder transistors of FIG. 6.

Control circuit 401 may include a plurality of programmable select cells 902 coupled to a multiplexer 901 through corresponding select lines 903. Output of multiplexer 901 may be a bias voltage, such as bias voltage 602 for example. Inputs to multiplexer 901 may be from any or all of a plurality of input sources 900. Any combination of these input sources, but not necessarily all of input sources 900, may be available for a design, test-program, and ATE setup. If multiple input sources 900 are available in a test-setup, then programmable select memory cells 902 may be programmable through a tester.

Examples of programmable select cells 902 may include JTAG (1149.1, 1500 or P1687) user-data-registers ("UDR") or configuration-cells in an FPGA. Examples of input sources may include external pin biases 911, on-die ("internally") generated biases 912, FPGA or other programmable fabric on/off biases 913, and programmable on/off biases 914. Input bias sources 913 and 914 may be digital inputs and may be used to apply a gate over-drive on a bleeder transistor, such as to increase sensitivity as previously described. Control circuit 401, as well as input sources 900, may be up and running before testing for shorts in IRPS domains. For example, a resistor ladder with multiple taps may be used to provide a variety of different bias voltages.

To recapitulate, current monitoring using external instrumentation to monitor DC currents drawn by a die under test have been described to avoid extra costs associated with burnt probe pins and excessive test time. The following description is for voltage monitoring, which may be used with ATE.

Figure 10A:
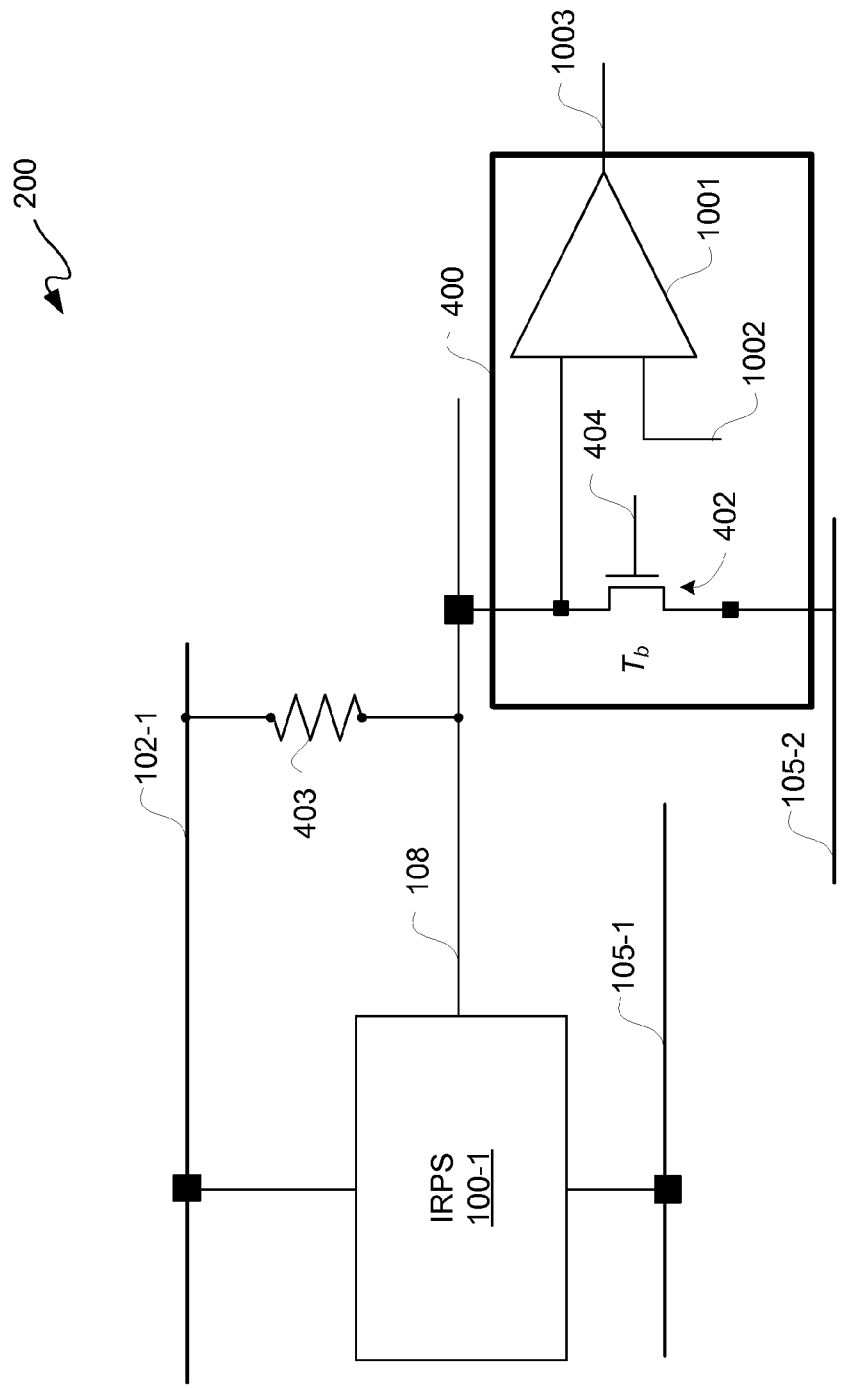
FIG. 10A is a block diagram depicting an exemplary IRPS grid with a bleeder transistor and a voltage comparator circuit.

FIG. 10A is a block diagram depicting an exemplary IRPS grid 200 with a bleeder transistor circuit 400. Bleeder transistor circuit 400 includes a comparator 1001 and a bleeder transistor 402. Optionally a current limiting resistor 413, such as previously described, may be coupled to bleeder transistor 402. A control circuit 401, such as described with reference to FIG. 6, may likewise be included in bleeder transistor circuit 400, such as previously described to provide a bias voltage, such as bias voltage 404.

Bleeder transistor circuit 400 is coupled for voltage monitoring. Generally, bleeder transistor circuit 400 is configured to compare a voltage on an internal supply 108 caused by hypothesized short defect with a reference voltage $V_{ref}$, monitor the voltage comparison, and, based on such comparison, the magnitude of such a short may be determined.

Configuration and coupling of bleeder transistor circuit 400 depends on which type shorts A through I are being targeted. Even though FIG. 4 is for a short type A, as generally indicated by short resistance 403, the following description may be applied to other types of shorts.

In this example, source supply 102-1 is assumed to be at $V_{dd}$. An NMOS bleeder transistor 402 has a drain node coupled to an internal supply 108 and has a source node coupled to a pin-accessible source ground 105-2, which may be coupled to or provided by an external instrument (e.g., Automated Test Equipment ("ATE")). Generally, any externally accessible pad may be used for a ground.

An NMOS bleeder transistor 402 may be used to couple internal supply 108 to source ground 105-2. A bias voltage 404 may be provided to a gate of transistor 402 to put NMOS bleeder transistor 402 in a conductive or on state. Bias voltage 404 may be provided from control circuit 401 to a gate of bleeder transistor 402. Additionally, bias voltage 404 may be used to adjust sensitivity of testing for a short resistance 403. Comparator 1001 may be coupled to a drain node of bleeder transistor 402 and a reference voltage 1002 as inputs for comparison to provide a comparator output 1003.

Figure 10B:
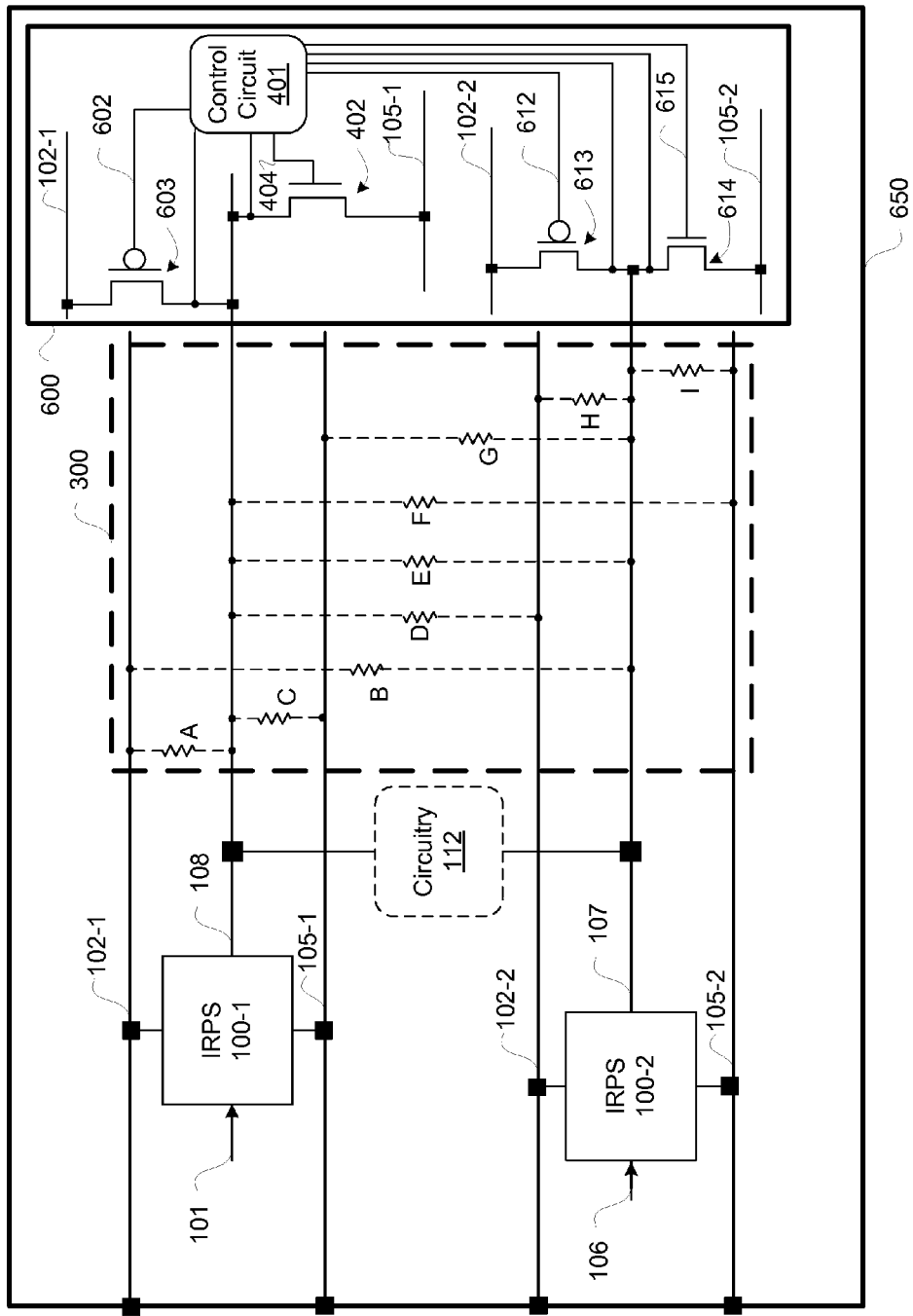
FIG. 10B is a circuit/block diagram depicting the exemplary IRPS grid of FIG. 2 with short defects of FIG. 3 and with the on-die test circuit of FIG. 6 coupled to the IRPS grid of an IC die for voltage monitoring.

Bleeder transistor 402 may be replaced with any of bleeder transistors 603, 613, or 614, though as source/drain coupled as described with reference to FIG. 6. Along those lines, FIG. 10B is a circuit/block diagram depicting IRPS grid 200 of FIG. 2 with short defects of FIG. 3 and with on-die test circuit 600 coupled to IRPS grid 200 of an IC die 650 for voltage monitoring. IC die 650 may be any IC die having an IRPS, including without limitation an FPGA die. FIG. 10B includes FIG. 10A and is similar to FIG. 6, except control circuit 401 includes a voltage sensing circuit, such as comparator 1001 or other voltage sensing circuit. Control circuit 401 may be coupled to a drain region of each of bleeder transistors 402, 603, 613, and 614. For control circuit 401 including a comparator 1001, control circuit 401 may be coupled to receive a reference voltage 1002. Otherwise, the description with reference to FIG. 6 applies to FIG. 10B, and accordingly such description is not repeated for purposes of clarity and not limitation.

Figure 11:
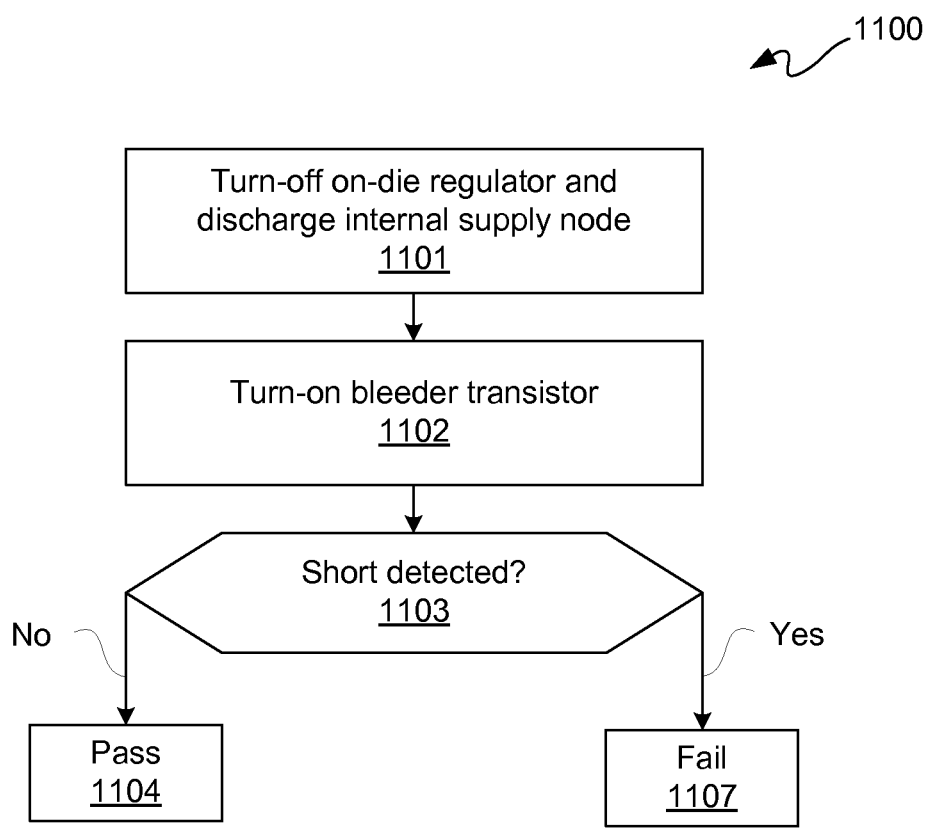
FIG. 11 is a flow diagram depicting an exemplary test flow for the IRPS grid of FIG. 10.

FIG. 11 is a flow diagram depicting an exemplary test flow 1100 for IRPS grid 200 of FIG. 10. With simultaneous reference to FIGS. 4, 10 and 11, test flow 1100 is further described.

For test flow 1100, an on-die regulator, such as IRPS 100-1 for example, is turned off at 1101. Further, as part of test initialization at 1101, comparator 1001 may be initialized to a default value, such default value may be when internal supply node 108 is discharged to ground by turning on bleeder transistor 402 to couple internal supply 108 to source ground 105-2.

At 1102, bleeder transistor 402 is put into a substantially conductive state ("turned on") by bias voltage 404 from control circuit 401. It should be understood that at least one bleeder transistor may be turned on at a time. For example, to test for short types A, B, C, D, F, G, H, and I, a single bleeder transistor of bleeder transistors 402, 603, 613, or 614 may be turned on for testing for an associated short, as previously described, while leaving all other bleeder transistors in an off state. For testing for a short type E, two bleeder transistors may be turned on while the other bleeder transistors are turned off, as previously described, while leaving all other bleeder transistors in an off state.

At 1103, it is determined if a short is detected. For bleeder transistor 402 in an on state as part of a short test, voltage on a drain node of bleeder transistor 402 may rise depending on presence, and if present, resistance value of short 403. If such drain node voltage rises above reference voltage 1002, comparator output 1003 switches state. Output of comparator 1001 may thus be monitored, including at an external pin, to determine whether a die passes or fails.

If there is no short or resistance of any short 403 is too high for parameters of this test, then IRPS grid 200 passes this test at 1104. However, if at 1103 a short 403 is detected as having resistance within detectable parameters of this test, IRPS grid 200 fails at 1107. Furthermore, at 1107, bleeder transistor 402 may be turned off to limit damage to a probe tip. Reference voltage 1002 determines a value of a highest detectable faulty resistance $R_F$. Reference voltage 1002 may be generated on-die and set at a value that accounts for leakage current. In the absence of any leakage current, reference voltage 1002 may be tied to ground for a highest sensitivity to short defect resistance. However, because generally some leakage current may exist in an operational die, reference voltage 1002 may be set to a value greater than ground which may result in some loss of sensitivity.

Figure 12:
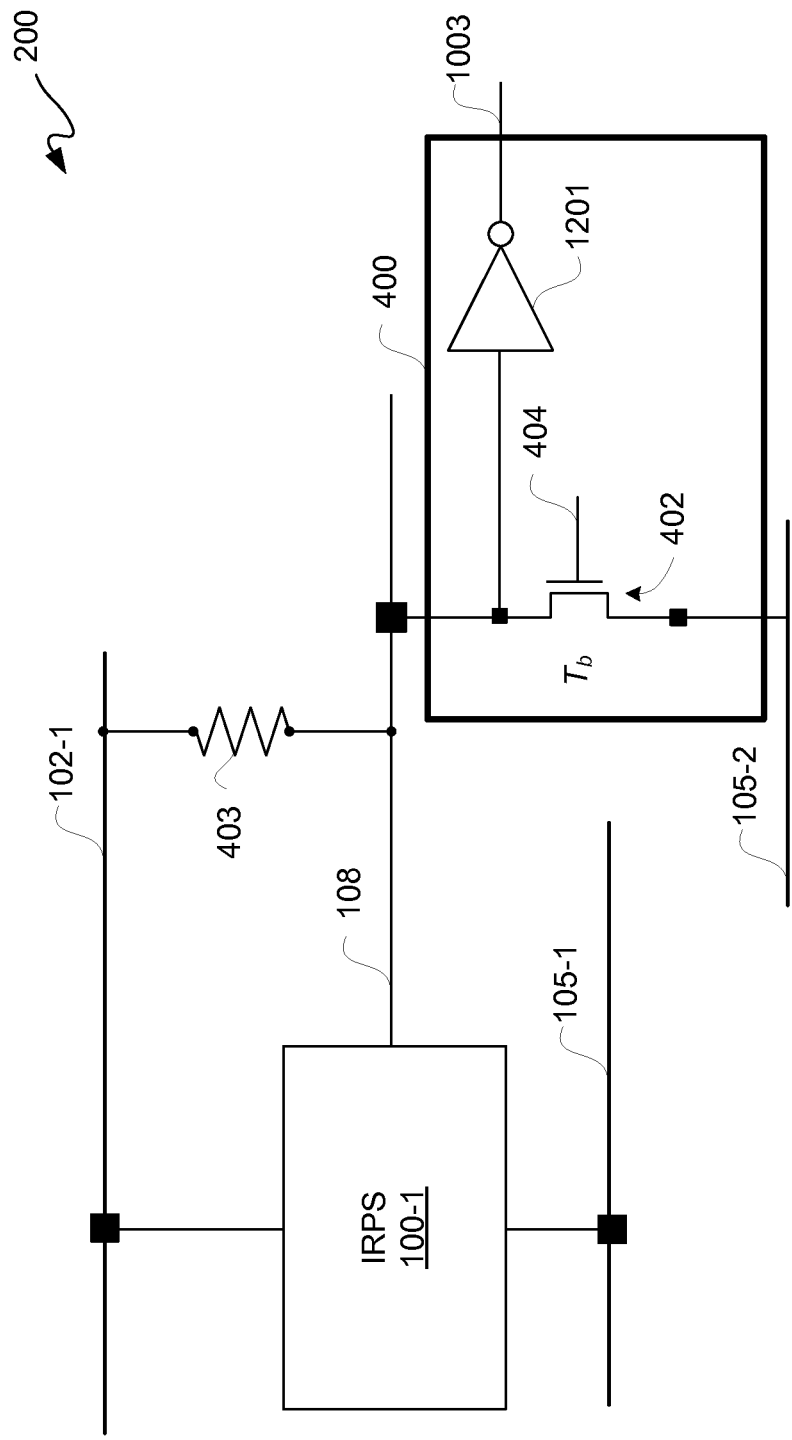
FIG. 12 is a block diagram depicting the exemplary IRPS grid of FIG. 2 with the bleeder transistor circuit of FIG. 10, except a comparator thereof is replaced with a buffer, which in this example is an inverter.

FIG. 12 is a block diagram depicting an exemplary IRPS grid 200 with bleeder transistor circuit 400 of FIG. 10, except comparator 1001 is replaced with an inverting buffer ("inverter") 1201. In another configuration, a non-inverter buffer 1201 may be used. Using an inverter 1201 as a short sensor rather than a comparator 1001 eliminates having a reference voltage 1002.

Using inverter 1201 for voltage monitoring is similar to using a voltage comparator 1001, except a reference voltage for inverter 1201 depends on a switch-over voltage of inverter 1201, which is greater than 0 volts. Thus, inverter 1201 may be less sensitive than some other examples of voltage monitoring and current monitoring as described herein.

Figure 13:
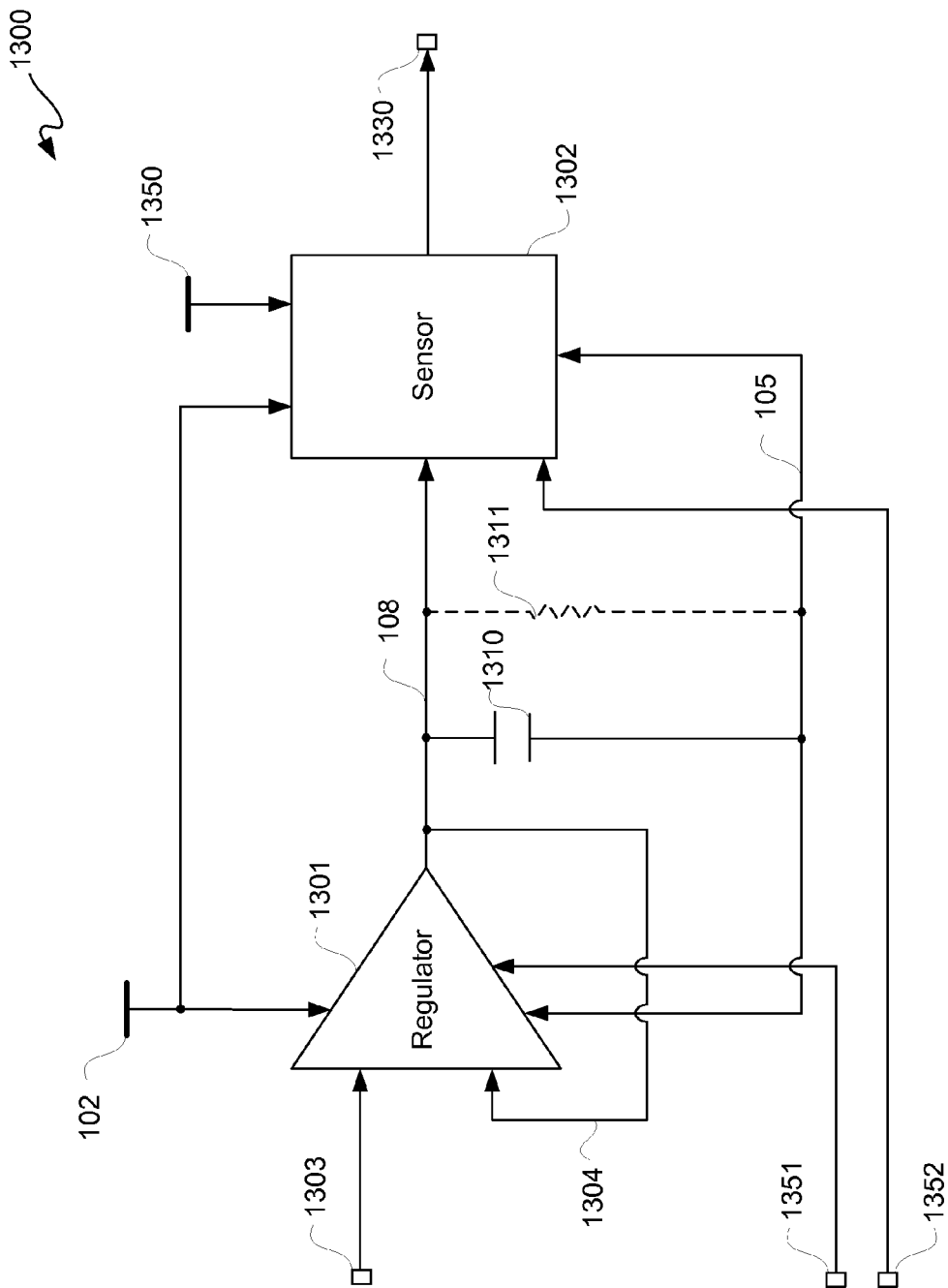
FIG. 13 is a block/circuit diagram depicting an exemplary voltage monitoring circuit.

FIG. 13 is a block/circuit diagram depicting an exemplary voltage monitoring circuit 1300. Voltage monitoring circuit 1300 includes a voltage sensor 1302 which may be coupled to monitor an on-die power regulator ("voltage regulator") 1301. Voltage regulator 1301 is coupled to receive a reference voltage 1303 and a feedback voltage 1304 from an output of voltage regulator 1301. Output of voltage regulator 1301 is coupled to a regulated voltage supply network, namely internal supply network 108. A power (or current sourcing) transistor of FIG. 1 may be assumed to be included in voltage regulator 1301. A capacitive load 1310 represented by a capacitor and a leakage path or short ("short") 1311 represented by a resistor may each in effect be coupled between internal supply network 108 and source ground 105.

Voltage regulator 1301 and voltage sensor 1302 may be coupled to be biased between source supply 102 and source ground 105. Voltage sensor 1302 may be coupled to a separate externally accessible test source supply 1350 with respect to source supply 102. Both voltage regulator 1301 and voltage sensor 1302 may be coupled to receive a power down signal 1351 and a test-on signal 1352. Sensor output 1330 from voltage sensor 1302 may be provided off-die.

Even though control circuit 401, comparator 1001, and inverter 1201 of bleeder transistor circuit 400 may be biased between a source supply 102 and a source ground 105, such bleeder transistor circuit 400 may be biased using a separate test source supply 1350. For testing, voltage and/or current on source supply 102 may be varied for testing purposes, while power provided via test source supply 1350 is generally held constant. Thus, for example, a variable $V_{dd}$ may be provided via source supply 102 for testing with a fixed $V_{dd}$ provided during such testing from test source supply 1350. However, such fixed $V_{dd}$ provided from test source supply 1350 need not be at a full logic high level for such supply for purposes of testing. Along those lines, a sufficient amount to just operate control circuit 401, comparator 1001, or inverter 1201 of bleeder transistor circuit 400 may be used. For example, if an inverter 1201 may be biased to a voltage between $V_{dd}/2$ and $V_{dd}$. Along those lines, multiple inverters may be coupled in series to provide a buffer inverter that effectively sharpens edges to provide a logic high state output in response to a logic low state input even though such inverters are biased to a voltage level for example of $0.8\ V_{dd}$.

On-die voltage regulator 1301 may be powered down responsive to assertion of power down signal 1351. Voltage sensor 1302 may be set to a predetermined voltage, and internal supply 108 is provided to voltage sensor 1302. Test-on signal 1352 may be asserted to ready voltage sensor 1302. A leakier or low resistance short 1311 may result in a lowering of voltage on internal supply 108. Voltage sensor 1302 may be configured to identify a drop in voltage due to presence of short 1311. If voltage on internal supply 108 drops below a threshold level, sensor output 1330 flips state to indicate presence of a short that in effect has too low a resistance to pass a die thereof.

Figure 14:
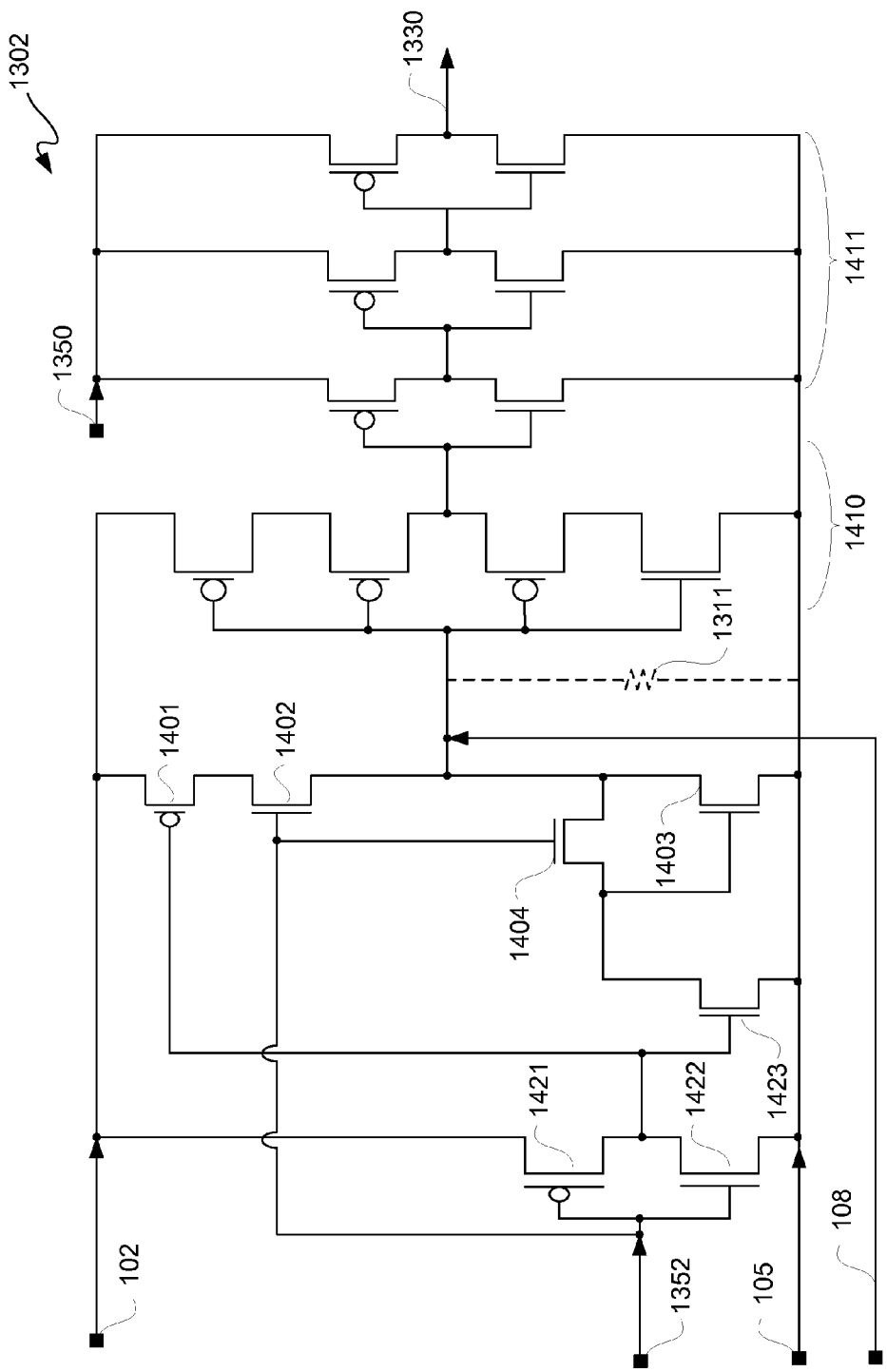
FIG. 14 is a circuit diagram depicting an exemplary voltage sensor.

FIG. 14 is a circuit diagram depicting an exemplary voltage sensor 1302. Generally, a PMOS bleeder transistor 1401 along with an NMOS transistor 1402 switch and NMOS leaker transistor 1403 sets a voltage on internal supply 108. If no short 1311 is present, transistors 1401 through 1403 are sized such that a forced voltage addresses reliability of internal circuitry 112 powered by internal supply 108. An NMOS transistor 1404 switch may be coupled to complete a diode connection for NMOS leaker transistor 1403, so NMOS leaker transistor 1403 turns off when a short 1311 is too strong due to a low resistance therefor. Voltage sensor 1302 may detect a short 1311 with a higher current flow, namely a current flow greater than leakage current due to devices powered by internal supply 108. A skewed inverter 1410 may be coupled between source supply 102 and source ground 105. Skewed inverter stage 1410 may be biased to prevent a premature flip of sensor output 1330 by voltage sensor 1302. In this example, a skewed inverter 1410 is provided with three PMOS transistors and one NMOS transistor. A buffer stage 1411, which in this example is formed with three inverters coupled in series, may be implemented to boost sensor output 1330 to provide strong drive strength for downstream routing. Buffer stage 1411 may be biased between external test source supply 1350 and source ground 105. An inverter formed of PMOS transistor 1421 and NMOS transistor 1422 is gated with test-on signal 1352 and outputs a complement of test-on signal 1352. An NMOS pull-down transistor 1423 is gated with such complement of test signal 1352 to provide control circuitry for sensing voltage.

Initially, test-on signal 1352 is logic low, and transistors 1401 through 1403 may be turned off. Skewed inverter stage 1410 may be driven by the value of an internal regulated supply on internal supply node 108. A regulator circuit generating such internal supply may be turned off, and a grid or network for internal supply node 108 may be pulled low during a test. Test-on signal 1352 may be used to drive pull down circuits. For these initial conditions, sensor output 1330 may be at a logic low level. Again, internal supply node 108 may be discharged prior to testing.

When test-on signal 1352 is logic high, a pull-down circuit in a regulator circuit may be disabled. A combination of transistors 1401 through 1403 may set voltage on internal supply node 108. In the absence of a short, namely a current leakage path with a measurable resistance as a short, internal supply node 108 ramps up to a known voltage level and output of skewed inverter stage 1410 flips, resulting in sensor output 1330 going high. If there is a short, sensor output 1330 remains low indicating a short. Switch transistor 1402 may serve as a shield to shield off noise from source supply 102 to internal supply node 108, which condition is useful while an internal regulator circuit is turned off. Voltage sensor 1302 may sense voltage drop higher than a load leakage and well below a current leakage due to short.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 15:
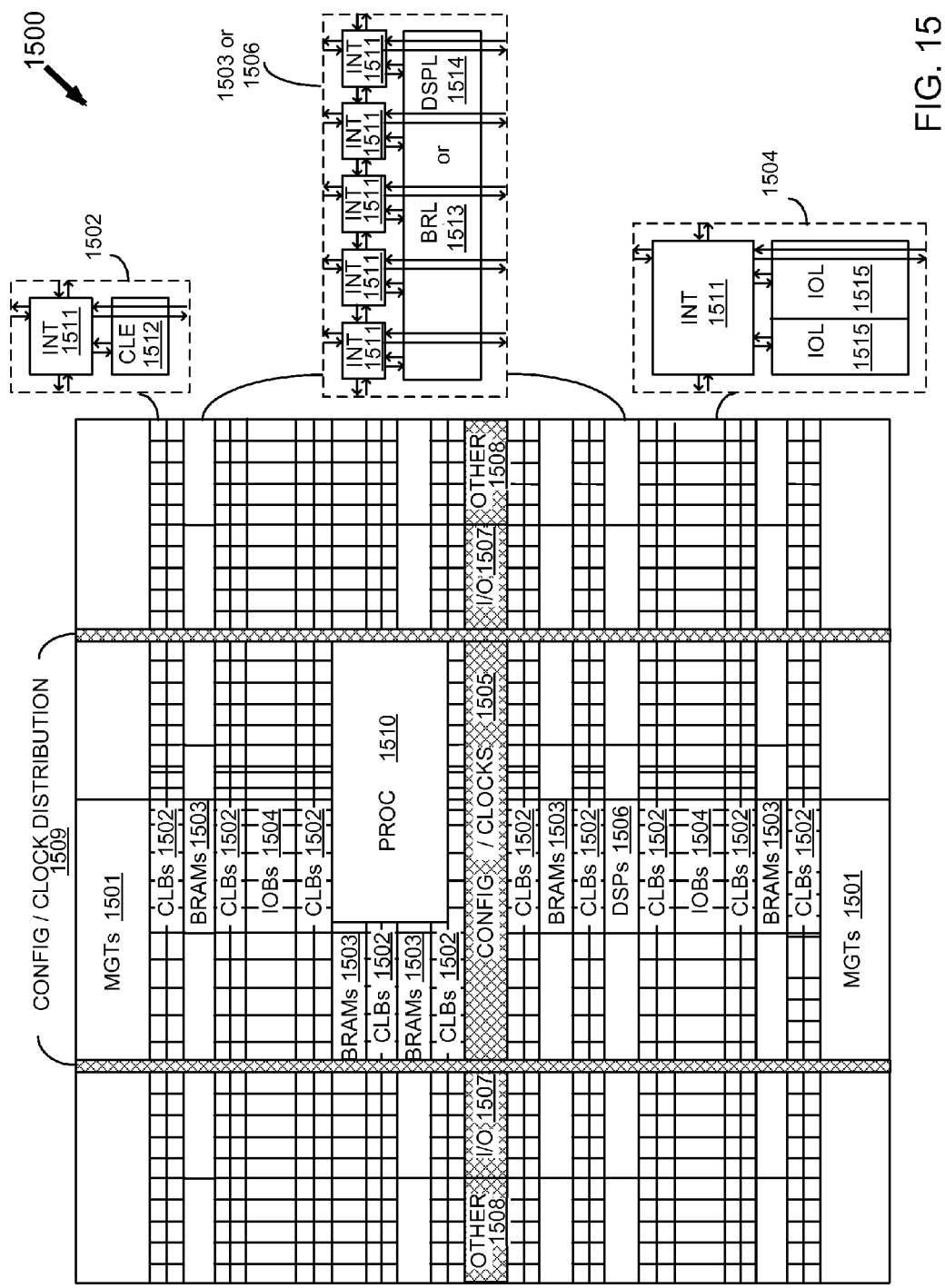
FIG. 15 is a simplified block diagram depicting an exemplary columnar Field Programmable Gate Array ("FPGA") architecture.

As noted above, advanced FPGAs can include several different types of programmable logic blocks in the array. For example, FIG. 15 illustrates an FPGA architecture 1500 that includes a large number of different programmable tiles including multi-gigabit transceivers ("MGTs") 1501, configurable logic blocks ("CLBs") 1502, random access memory blocks ("BRAMs") 1503, input/output blocks ("IOBs") 1504, configuration and clocking logic ("CONFIG/CLOCKS") 1505, digital signal processing blocks ("DSPs") 1506, specialized input/output blocks ("I/O") 1507 (e.g., configuration ports and clock ports), and other programmable logic 1508 such as digital clock managers, analog-to-digital converters, system monitoring logic, and so forth. Some FPGAs also include dedicated processor blocks ("PROC") 1510.

In some FPGAs, each programmable tile includes a programmable interconnect element ("INT") 1511 having standardized connections to and from a corresponding interconnect element in each adjacent tile. Therefore, the programmable interconnect elements taken together implement the programmable interconnect structure for the illustrated FPGA. The programmable interconnect element 1511 also includes the connections to and from the programmable logic element within the same tile, as shown by the examples included at the top of FIG. 15.

For example, a CLB 1502 can include a configurable logic element ("CLE") 1512 that can be programmed to implement user logic plus a single programmable interconnect element ("INT") 1511. A BRAM 1503 can include a BRAM logic element ("BRL") 1513 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 1506 can include a DSP logic element ("DSPL") 1514 in addition to an appropriate number of programmable interconnect elements. An IOB 1504 can include, for example, two instances of an input/output logic element ("IOL") 1515 in addition to one instance of the programmable interconnect element 1511. As will be clear to those of skill in the art, the actual I/O pads connected, for example, to the I/O logic element 1515 typically are not confined to the area of the input/output logic element 1515.

In the pictured embodiment, a horizontal area near the center of the die (shown in FIG. 15) is used for configuration, clock, and other control logic. Vertical columns 1509 extending from this horizontal area or column are used to distribute the clocks and configuration signals across the breadth of the FPGA.

Some FPGAs utilizing the architecture illustrated in FIG. 15 include additional logic blocks that disrupt the regular columnar structure making up a large part of the FPGA. The additional logic blocks can be programmable blocks and/or dedicated logic. For example, processor block 1510 spans several columns of CLBs and BRAMs.

Note that FIG. 15 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 15 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
an integrated circuit die having a regulated power supply, a power supply grid, and a test circuit;
wherein the regulated power supply is biased between a source supply node and a source ground node;
wherein the source supply node and the source ground node are externally accessible nodes of the integrated circuit die;
wherein an internal supply node of the power supply grid is coupled to an output side of the regulated power supply, the internal supply node being inaccessible to direct probe pin contact;
wherein the test circuit is coupled to the internal supply node of the power supply grid;
wherein the test circuit is configured to test for at least one short in the power supply grid, the at least one short including at an end thereof an inaccessible node to direct probe pin contact;
wherein the test circuit is configured to limit power through the power supply grid to less than that of a probe tip tolerance; and
wherein the test circuit is configured to test for the at least one short with background current leakage of the power supply grid being present.

2. The apparatus according to claim 1, wherein:
the regulated power supply is a first regulated power supply
the source supply node is a first source supply node;
the source ground node is a first source ground node;
the apparatus further comprising:
a second regulated power supply of the integrated circuit die;
wherein the second regulated power supply is biased between a second source supply node and a second source ground node;
wherein the second source supply node and the second source ground node are externally accessible nodes of the integrated circuit die; and
wherein an internal ground node of the power supply grid is coupled to an output side of the second regulated power supply, the internal ground node being inaccessible to direct probe pin contact.

3. The apparatus according to claim 2, wherein the test circuit is configured to monitor current to detect whether the at least one short is present in the power supply grid.

4. The apparatus according to claim 3, wherein:
the test circuit includes a bleeder transistor and a control circuit;
the control circuit is coupled to provide a bias voltage to a gate of the bleeder transistor;
the bleeder transistor has a drain region coupled to the internal supply node and a source region coupled to the first source ground node; and
the bleeder transistor is coupled to detect presence of the at least one short as between the source supply node and the internal supply node.

5. The apparatus according to claim 3, wherein:
the test circuit includes a bleeder transistor and a control circuit;
the control circuit is coupled to provide a bias voltage to a gate of the bleeder transistor;

the bleeder transistor has a drain region coupled to the internal ground node and a source region coupled to the source ground node; and the bleeder transistor is biased to detect presence of the at least one short as between at least one of the first source supply node and the internal ground node, the first source ground node and the internal ground node, or the second source supply node and the internal ground node.

6. The apparatus according to claim 3, wherein:

the test circuit includes a bleeder transistor and a control circuit;

the control circuit is coupled to provide a bias voltage to a gate of the bleeder transistor;

the bleeder transistor has a drain region coupled to the internal supply node and a source region coupled to the first source supply node; and the bleeder transistor is biased to detect presence of the at least one short as between at least one of the internal supply node and the first source ground node, the internal supply node and the second source supply node, or the internal supply node and the second source ground node.

7. The apparatus according to claim 3, wherein:

the test circuit includes a first bleeder transistor, a second bleeder transistor, and a control circuit;

the control circuit is coupled to provide a bias voltage to a gate of each of the first bleeder transistor and the second bleeder transistor;

the first bleeder transistor has a first drain region coupled to the internal supply node and a first source region coupled to the first source supply node;

the second bleeder transistor has a second drain region coupled to the internal ground node and a second source region coupled to the second source ground node; and the first bleeder transistor and the second bleeder transistor are biased to detect presence of the at least one short as between the internal supply node and the internal ground node.

8. The apparatus according to claim 3, wherein:

the test circuit includes a bleeder transistor and a control circuit;

the control circuit is coupled to provide a bias voltage to a gate of the bleeder transistor;

the bleeder transistor has a drain region coupled to the internal ground node and a source region coupled to the second source supply node; and the bleeder transistor is coupled to detect presence of the at least one short as between the internal ground node and the second source ground node.

9. The apparatus according to claim 1, wherein the test circuit is configured to monitor voltage to detect whether the at least one short is present in the power supply grid.

10. The apparatus according to claim 9, wherein:

the test circuit includes a bleeder transistor and a control circuit;

the control circuit is coupled to provide a bias voltage to a gate of the bleeder transistor;

the bleeder transistor has a drain region coupled to the control circuit and the internal supply node and a source region coupled to the first source ground node; and the bleeder transistor is coupled to detect presence of the at least one short as between the source supply node and the internal supply node.

11. The apparatus according to claim 9, wherein:

the test circuit includes a bleeder transistor and a control circuit;

the control circuit is coupled to provide a bias voltage to a gate of the bleeder transistor;

the bleeder transistor has a drain region coupled to the control circuit and the internal ground node and a source region coupled to the source ground node; and the bleeder transistor is biased to detect presence of the at least one short as between at least one of the first source supply node and the internal ground node, the first source ground node and the internal ground node, or the second source supply node and the internal ground node.

12. The apparatus according to claim 9, wherein:

the test circuit includes a bleeder transistor and a control circuit;

the control circuit is coupled to provide a bias voltage to a gate of the bleeder transistor;

the bleeder transistor has a drain region coupled to the control circuit and the internal supply node and a source region coupled to the first source supply node; and the bleeder transistor is biased to detect presence of the at least one short as between at least one of the internal supply node and the first source ground node, the internal supply node and the second source supply node, or the internal supply node and the second source ground node.

13. The apparatus according to claim 9, wherein:

the test circuit includes a first bleeder transistor, a second bleeder transistor, and a control circuit;

the control circuit is coupled to provide a bias voltage to a gate of each of the first bleeder transistor and the second bleeder transistor;

the first bleeder transistor has a first drain region coupled to the control circuit and the internal supply node and a first source region coupled to the first source supply node;

the second bleeder transistor has a second drain region coupled to the control circuit and the internal ground node and a second source region coupled to the second source ground node; and the first bleeder transistor and the second bleeder transistor are biased to detect presence of the at least one short as between the internal supply node and the internal ground node.

14. The apparatus according to claim 9, wherein:

the test circuit includes a bleeder transistor and a control circuit;

the control circuit is coupled to provide a bias voltage to a gate of the bleeder transistor;

the bleeder transistor has a drain region coupled to the control circuit and the internal ground node and a source region coupled to the second source supply node; and the bleeder transistor is coupled to detect presence of the at least one short as between the internal ground node and the second source ground node.

15. The apparatus according to claim 9, wherein:

the test circuit includes a bleeder transistor and a control circuit;

the control circuit is coupled to provide a bias voltage to a gate of the bleeder transistor;

the bleeder transistor has a drain region coupled to an inverter of the control circuit; and the inverter is coupled to be powered at less than a logic high voltage level to detect the at least one short.

16. The apparatus according to claim 9, wherein:

the test circuit includes a bleeder transistor and a control circuit;

the control circuit is coupled to provide a bias voltage to a gate of the bleeder transistor;

the bleeder transistor has a drain region coupled to a comparator of the control circuit; and the comparator is coupled to receive a reference voltage to detect the at least one short by comparison with an output voltage on the drain region.

17. A method, comprising:

powering up an integrated circuit die having a regulated power supply, a power supply grid, and a test circuit;

wherein the regulated power supply is biased between a source supply node and a source ground node;

wherein the source supply node and the source ground node are externally accessible nodes of the integrated circuit die;

wherein an internal supply node of the power supply grid is coupled to an output side of the regulated power supply, the internal supply node being inaccessible to direct probe pin contact;

wherein the test circuit is coupled to the internal supply node of the power supply grid;

turning off the regulated power supply;

biasing at least one bleeder transistor of the test circuit to limit current flow through a channel of the at least one bleeder transistor;

wherein the test circuit is configured to test for at least one short in the power supply grid, the at least one short including at an end thereof the internal supply node;

wherein the test circuit is configured to limit power through the power supply grid to less than that of a probe tip tolerance;

wherein the test circuit is configured to test for the at least one short with background current leakage of the power supply grid being present; and monitoring output of the test circuit to determine whether the power supply grid has the at least one short.

18. The method according to claim 17, wherein the monitoring of the output is associated with voltage monitoring.

19. The method according to claim 17, wherein the monitoring of the output is associated with current monitoring.

* * * * *